United States Patent
Shukuri et al.

(10) Patent No.: US 7,023,062 B2
(45) Date of Patent: Apr. 4, 2006

(54) SEMICONDUCTOR INTEGRATED CIRCUIT DEVICE HAVING DEPOSITED LAYER FOR GATE INSULATION

(75) Inventors: Shoji Shukuri, Koganei (JP); Norio Suzuki, Mito (JP); Yasuhiro Taniguchi, Kodaira (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/635,511

(22) Filed: Aug. 7, 2003

(65) Prior Publication Data

US 2004/0031988 A1 Feb. 19, 2004

Related U.S. Application Data

(60) Continuation of application No. 09/961,360, filed on Sep. 25, 2001, now Pat. No. 6,646,313, which is a division of application No. 09/208,019, filed on Dec. 9, 1998, now Pat. No. 6,376,316.

(30) Foreign Application Priority Data

Dec. 9, 1997 (JP) ................................. 9-338586

(51) Int. Cl.
*H01L 29/76* (2006.01)
(52) U.S. Cl. ........................ 257/392; 257/406; 257/411
(58) Field of Classification Search ................ 257/392, 257/406, 411
See application file for complete search history.

(56) References Cited

U.S. PATENT DOCUMENTS

| | | | |
|---|---|---|---|
| 5,104,819 A | 4/1992 | Freiberger et al. | |
| 5,285,096 A | 2/1994 | Ando et al. | |
| 5,293,336 A | 3/1994 | Ishii et al. | |
| 5,723,355 A | 3/1998 | Chang et al. | |
| 5,792,670 A | 8/1998 | Pio et al. | |
| 5,861,347 A | 1/1999 | Maiti et al. | |
| 5,966,616 A | 10/1999 | Woerlee | |

(Continued)

FOREIGN PATENT DOCUMENTS

JP 4-122063 4/1992

(Continued)

OTHER PUBLICATIONS

Korean Office Action, dated Sep. 30, 2005, Application No. 10-1998-0053407.

*Primary Examiner*—Long Pham
(74) *Attorney, Agent, or Firm*—Antonelli, Terry, Stout and Kraus, LLP.

(57) ABSTRACT

A method for manufacturing a semiconductor integrated circuit device including a first field effect transistor having a gate insulating film formed over a first element forming region of a main surface of a semiconductor substrate; and a second field effect transistor having a gate insulating film formed over a second element forming region of the main surface of the semiconductor substrate and made thinner than the gate insulating film of the first field effect transistor. The method comprises the steps of forming a thermally oxidized film over a first element forming region and a second element forming region of the main surface of the semiconductor substrate; forming a deposited film over the main surface of the semiconductor substrate including said thermally oxidized film; removing the deposited film and said thermally oxidized film from over the second element forming region; and forming a thermally oxidized film over the second element forming region to form a gate insulating film individually over the first element forming region and the second element forming region.

6 Claims, 36 Drawing Sheets

U.S. PATENT DOCUMENTS

| | | |
|---|---|---|
| 5,989,962 A | 11/1999 | Holloway et al. |
| 6,004,847 A | 12/1999 | Clementi et al. |
| 6,025,234 A | 2/2000 | Chou |
| 6,037,201 A | 3/2000 | Tsai et al. |
| 6,048,769 A | 4/2000 | Chau |
| 6,090,652 A | 7/2000 | Kim |
| 6,110,782 A | 8/2000 | Chu et al. |
| 6,114,203 A | 9/2000 | Ghidini et al. |
| 6,117,736 A | 9/2000 | Kapoor |
| 6,281,558 B1 | 8/2001 | Sayama et al. |
| 6,376,316 B1 * | 4/2002 | Shukuri et al. ............. 438/275 |
| 6,646,313 B1 * | 11/2003 | Shukuri et al. ............. 257/392 |

FOREIGN PATENT DOCUMENTS

| | | |
|---|---|---|
| JP | 6-61499 | 3/1994 |
| JP | 06-61499 | 3/1994 |
| JP | 6-244366 | 9/1994 |
| JP | 8-204142 | 8/1996 |
| JP | 08-204142 | 8/1996 |
| JP | 9-107028 | 4/1997 |
| JP | 9-181159 | 7/1997 |
| JP | 9-260484 | 10/1997 |
| JP | 10-022397 | 1/1998 |

* cited by examiner

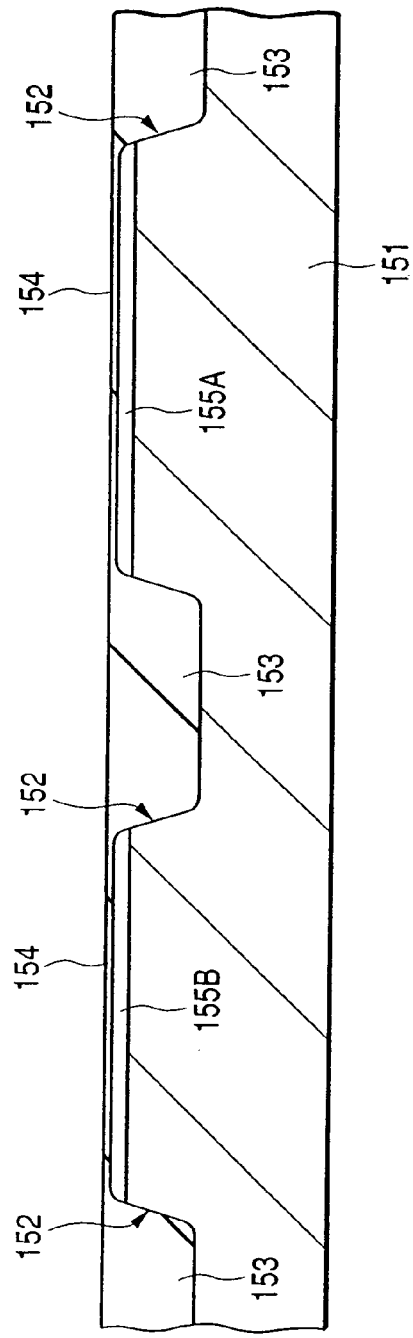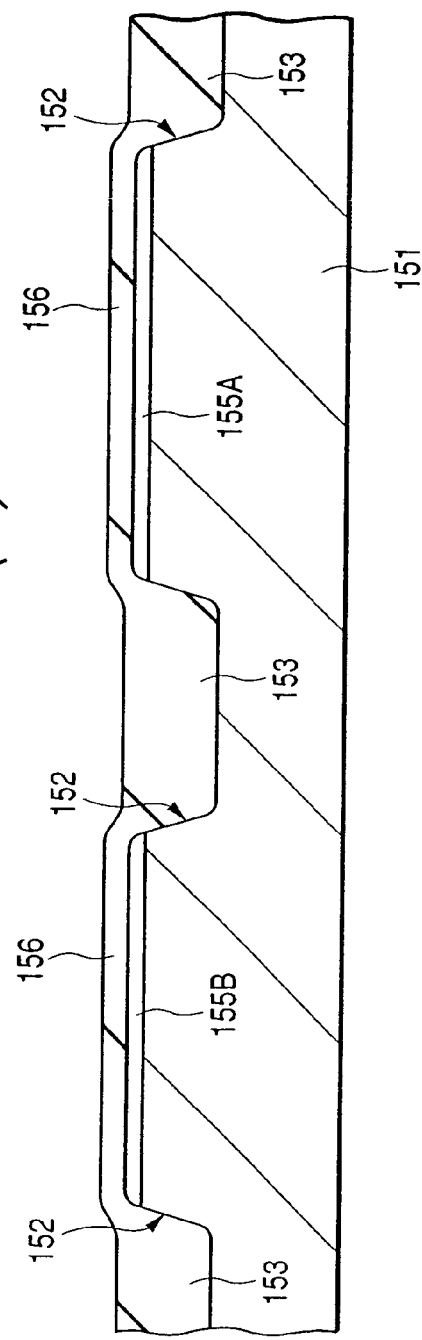
FIG. 40(A)
FIG. 40(B)

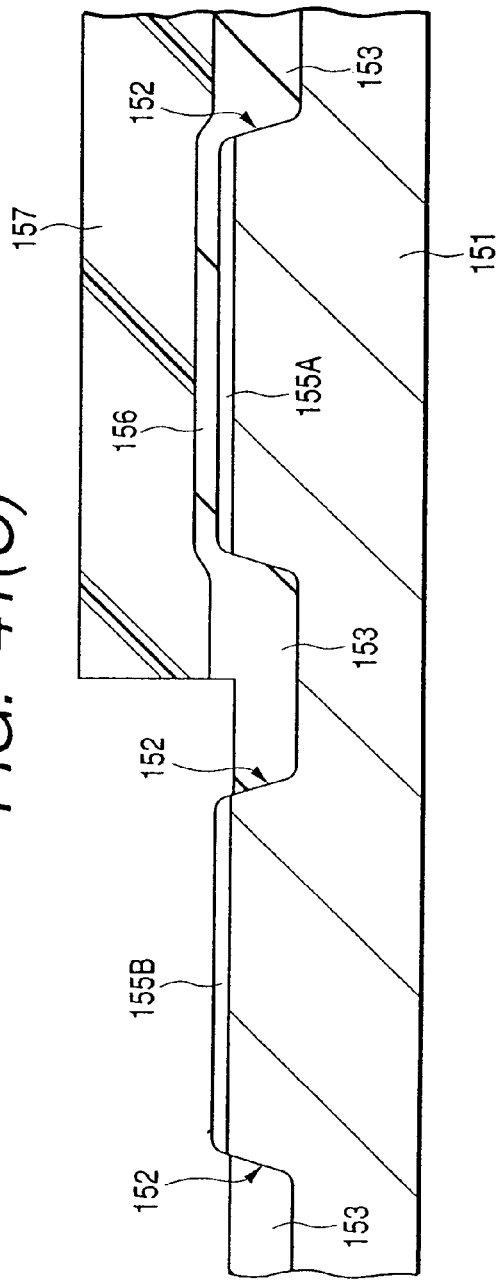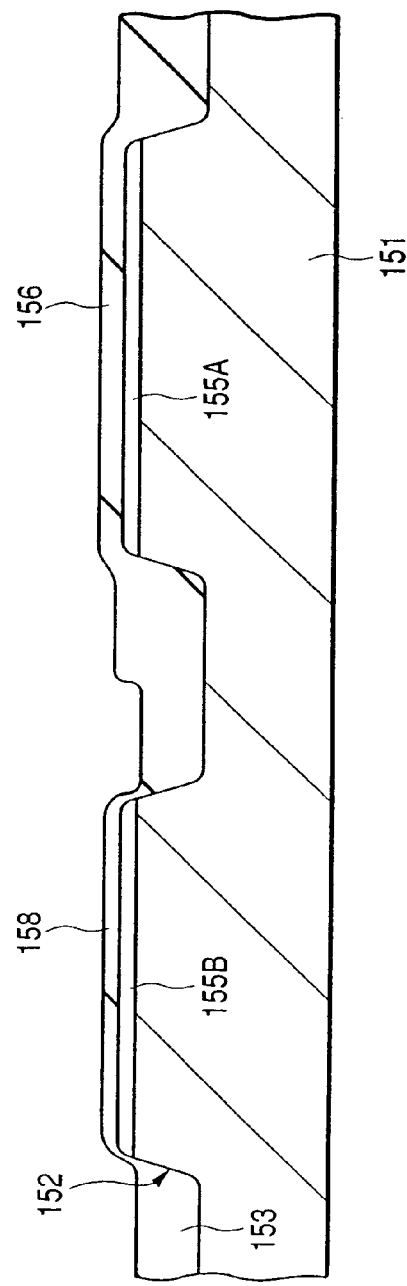

US 7,023,062 B2

SEMICONDUCTOR INTEGRATED CIRCUIT DEVICE HAVING DEPOSITED LAYER FOR GATE INSULATION

This application is a Continuation application of application Ser. No. 09/961,360, filed Sep. 25, 2001, now U.S. Pat. No. 6,646,313, which is a Divisional application of application Ser. No. 09/208,019, filed Dec. 9, 1998, now U.S. Pat. No. 6,376,316, a Continued Prosecution Application (CPA) thereof having been filed Aug. 13, 2001, the contents of application Ser. No. 09/208,019 being incorporated herein by reference in their entirety.

FIELD OF THE INVENTION

The present invention relates to a semiconductor integrated circuit device and, more particularly, to a technique which is effective when applied to a semiconductor integrated circuit device including a plurality of kinds of field effect transistors having gate insulating films of different thicknesses.

BACKGROUND OF THE INVENTION

One of the techniques supporting the high integration of a semiconductor memory is known as element isolation. The element isolation of a semiconductor integrated circuit-device using the 0.25-microns technique, such as a random access memory (hereinafter abbreviated to the DRAM) of 64 Mbits, has been developed from the LOCOS (Local Oxidation of silicon) element isolation of the prior art to the so-called groove type element isolation, in which element forming regions are insulated and isolated by forming grooves in the element isolating regions of a silicon substrate and by forming a buried insulating film in the grooves. This groove type element isolation enables an element isolation length of 0.3 microns or less, which has been impossible to achieve by the LOCOS element isolation, thereby to improve the degree of memory isolation greatly.

Meanwhile, in addition to the market needs for a lower voltage and small power consumption, the rapid spread of portable devices, such as the PDAs (Personal Digital Assistants) and electronic still cameras, has intensified the demand for the simultaneous on-chip location of the elements which have been formed in different chips in the prior art. For example, microcomputers have been manufactured having a built-in flash memory or microcomputers having a built-in DRAM of an intermediate capacity have been manufactured.

SUMMARY OF THE INVENTION

On these semiconductor integrated circuit devices having devices of different functions, there are mounted a plurality of kinds of field effect transistors having different operating voltages. For the operations to write/erase information in/from the flash memory, for example, a voltage as high as 15 to 20 [V] is required, so that in part of the peripheral circuits, field effect transistors having a gate insulating film with a thickness of 15 to 25 [nm] capable of withstanding such a voltage application are used. In the logic circuit section of the microcomputer operating at an ordinary voltage of 3.3 [V], there are used field effect transistors having a gate insulating film with a thickness of 7 to 10 [nm]. In order to realize high-speed operation at a supply voltage as low as about 1.8 [V] in a microcomputer with a built-in flash memory according to the 0.25 micron technique of recent years, there are used in the logic circuit section, field effect transistors which have a gate insulating film with a thickness of 4 to 5 [nm]. In order that the input/output units may operate also at 3.3 [V], it is necessary to form gate insulating films of three types: a gate insulating film having a thickness of 4 to 5 [nm] (for 1.8 [V]); a gate insulating film having a thickness of 7 to 10 [nm] for 3.3 [V]); and a gate insulating film having a thickness of 15 to 25 [nm] (for a flash memory). In short, it is necessary to form gate insulating films having three different thicknesses.

We have discovered the following problem by investigating the technique used when two kinds of gate insulating films having different thicknesses are separately formed over two elements forming regions of the silicon substrate, insulated and isolated by the aforementioned groove type element isolation. This problem will be described with reference to FIGS. 40(A) to 46. Of FIGS. 40(A) to 46, FIGS. 40(A) to 44 are sections for explaining the problem, FIGS. 40(A) to 42 are sections (corresponding to a later-described FIG. 2) of a field effect transistor, taken in the gate length direction, and FIGS. 43 and 44 are sections (corresponding to a later description referring to FIG. 3) of a field effect transistor, taken in the gate width direction. FIG. 45 is a diagram for comparing the breakdown voltage distribution (a) of a capacitor with the groove type element isolation and the breakdown voltage distribution (b) of a capacitor with the LOCOS element isolation. FIG. 46 is a diagram for comparing the sub-thresh characteristics (a) of a field effect transistor with the groove type element isolation and sub-thresh characteristics (b) of a field effect transistor with the LOCOS element isolation. In FIG. 45, the abscissa indicates a capacitor gate applied voltage, and the ordinate indicates the cumulative number of defects. In FIG. 46, the abscissa indicates the gate voltage, and the ordinate indicates the drain current.

First, as shown in FIG. 40(A), the groove type element isolation is achieved by forming grooves 152 for defining a first element forming region and a second element forming region in element isolating regions of a main surface of a silicon substrate 151, and subsequently by forming a buried insulating film 153 of a silicon oxide film in the grooves 152. After this, an impurity introducing buffer insulating film 154 is formed over the first element forming region and the second element forming region. After this, channel implantation layers 155A and 155B for controlling the threshold voltages of the field effect transistors are individually formed in the individual surface layers of the first element forming region and the second element forming region.

Next, the buffer insulating film 154 is removed, and thermal oxidation is then executed to form a gate insulating film 156 made of a thermally oxidized ($SiO_2$) film having a thickness of about 20 [nm], over the first element forming region and the second element forming region, as shown in FIG. 40(B).

Next, a mask 157 is formed by using the photolithographic technique so as to cover the first element forming region, while leaving the second element forming region open.

Next, the mask 157 is used as an etching mask to remove the gate insulating film 156 from over the second element forming region by a wet-etching method using an aqueous solution of hydrofluoric acid, as shown in FIG. 41(C).

Next, the mask 157 is removed, and thermal oxidation is executed to form a gate insulating film 158 of a thermally oxidized ($SiO_2$) film having a thickness of about 5 [nm], over the second element forming region, as shown in FIG. 41(D). At this step, the gate insulating film 156 and the gate insulating film 158 of different thicknesses can be separately formed over the first element forming region and the second element forming region which are insulated and isolated by the groove type element isolation.

Next, gate electrodes 159 of a polycrystalline silicon film doped with an impurity are individually formed over the first element forming region and the second element forming region. After this, a pair of semiconductor regions 160 for the source region and the drain region are formed in the surface layer of the first element forming region. After this, a pair of semiconductor regions for the source region and the drain region are formed in the surface layer of the second element forming region. Thus, there are formed a field effect transistor Q12 and a field effect transistor Q13 having gate insulating films of different thicknesses, as shown in FIG. 42. Here, the individual gate electrodes of the field effect transistors Q12 and Q13 are so formed that their gate electrodes in the gate width direction are led out over the buried insulating film 153, as shown in FIGS. 43 and 44.

In the separate formation of the gate insulating films by the technique of the prior art, when the gate insulating film 156 is removed from the second element forming region by a wet-etching method, the buried insulating film 153 buried in the grooves 152 is simultaneously etched off, as shown in FIG. 41(C). As a result, a step exposing the side faces of the second element forming region is formed in the end portions of the element isolating regions between the second element forming region and the element isolating region. According to the experiments made by the inventors, a step 25 [nm] is formed in the case of the gate insulating film, which is formed so as to have a thickness of 4.5 [nm] over the second element forming region. There are two major problems caused by this step.

The first problem is that the gate insulating film 158 is thinned by the mechanical stress concentration on the stepped portion, as indicated by arrow 162 in FIG. 44, at the end portions of the element isolating regions between the second element forming region and the element isolating region, so that the reliability of the gate insulating film 158 is deteriorated. In the groove element isolation, as shown in FIG. 45 by characteristic (a), the breakdown voltage is lowered by 5 to 10% from that of the LOCOS element isolation, as shown in FIG. 45 by characteristic (b).

The second problem is that the characteristics of the field effect transistor Q13 are varied because the channel implantation concentration in the vicinity of the bottom of the step on the side faces of the second element forming region drops to a lower level than that of the channel implantation layer 155b of the flat portion, as indicated by arrow 163 in FIG. 44. In the groove type element isolation, as shown in FIG. 46 by characteristic (a), the phenomenon called a kink in which the voltage current characteristics change in the course occurs, causing problems, i.e., a drop in the threshold voltage of the field effect transistor Q13, and a variation thereof.

An object of the invention is to provide a technique which is capable of enhancing the reliability of a semiconductor integrated circuit device which includes a plurality of kinds of field effect transistors having gate insulating films of different thicknesses.

The above-specified and other objects and novel features of the invention will become apparent from the following description to be made with reference to the accompanying drawings.

A representative aspect of the invention to be described herein will be summarized in the following.

There is provided a method for manufacturing a semiconductor integrated circuit device including a first field effect transistor having a gate insulating film formed over a first element forming region of a main surface of a semiconductor substrate, and a second field effect transistor having a gate insulating film formed over a second element forming region of the main surface of the semiconductor substrate and which is made thinner than the gate insulating film of the first field effect transistor. The manufacturing method comprises the steps of forming a thermally oxidized film over the first element forming region and the second element forming region of the main surface of the semiconductor substrate; subsequently forming a deposited film over the main surface of the semiconductor substrate including the thermally oxidized film; subsequently removing the deposited film and the thermally oxidized film from over the second element forming region; and subsequently forming a thermally oxidized film over the second element forming region to form a gate insulating film individually over the first element forming region and the second element forming region.

The first element forming region and the second element forming region are individually insulated and isolated by grooves, which are formed in the element isolating regions of the main surface of the semiconductor substrate, and a buried insulating film which is buried in the grooves.

By the aforementioned means, when the deposited film and the thermally oxidized film formed over the second element forming region are removed, the etching rate of the buried insulating film can be reduced to an extent corresponding to the thickness of the deposited film because the buried insulating film is covered with the deposited film, so that it is not etched until the deposited film is removed. As a result, the step formed at the end portions of the element isolating regions between the second element forming region and the element isolating region can be reduced to avoid the deterioration and the characteristic variation of the gate breakdown voltage, which might otherwise be caused by the step, of the field effect transistors. As a result, it is possible to enhance the reliability of the semiconductor integrated circuit device.

As the ratio of the thickness of the deposited film to the thickness of the gate insulating film formed over the first element forming region increases, the thermally oxidized film formed over the second element forming region is made thinner, so that the etching rate of the buried insulating film can be reduced. The etching rate of the buried insulating film is increased in proportion to the thickness of the thermally oxidized film.

BRIEF DESCRIPTION OF THE DRAWINGS

FIGS. 40(A) and 40(B) are sections for illustrating a problem;

FIGS. 41(C) and 41(D) are sections for illustrating the problem;

DESCRIPTION OF THE PREFERRED EMBODIMENTS

Figure 1:
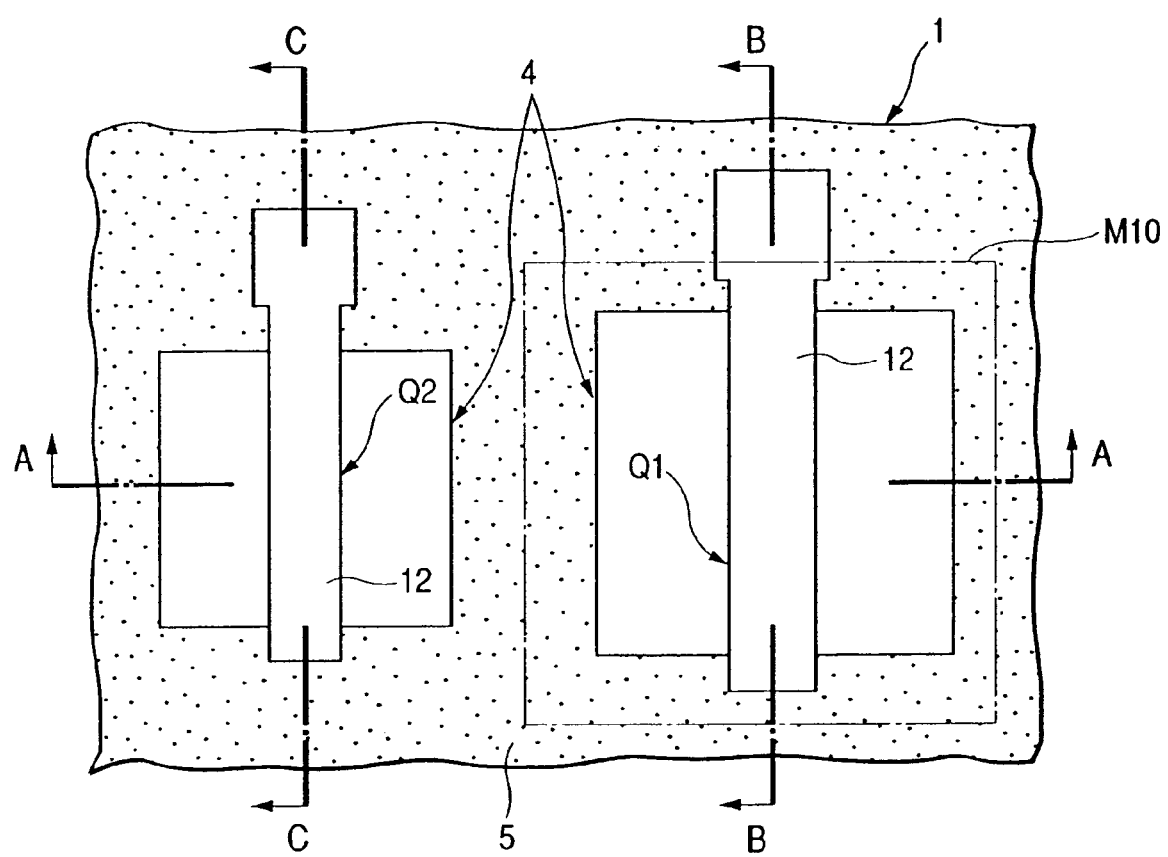
FIG. 1 is a schematic top plan view showing two field effect transistors mounted in a semiconductor integrated circuit device representing an Embodiment 1 according to the invention.

The invention will be described in detail in connection with various embodiments and with reference to the accompanying drawings.

Throughout all the drawings for illustrating the embodiments of the invention, the portions having identical functions will be designated by identical reference numerals, and their repeated description will be omitted.

[Embodiment 1]

In this embodiment, the invention is applied to a semiconductor integrated circuit device including two kinds of field effect transistors having gate insulating films of different thicknesses.

Figure 2:
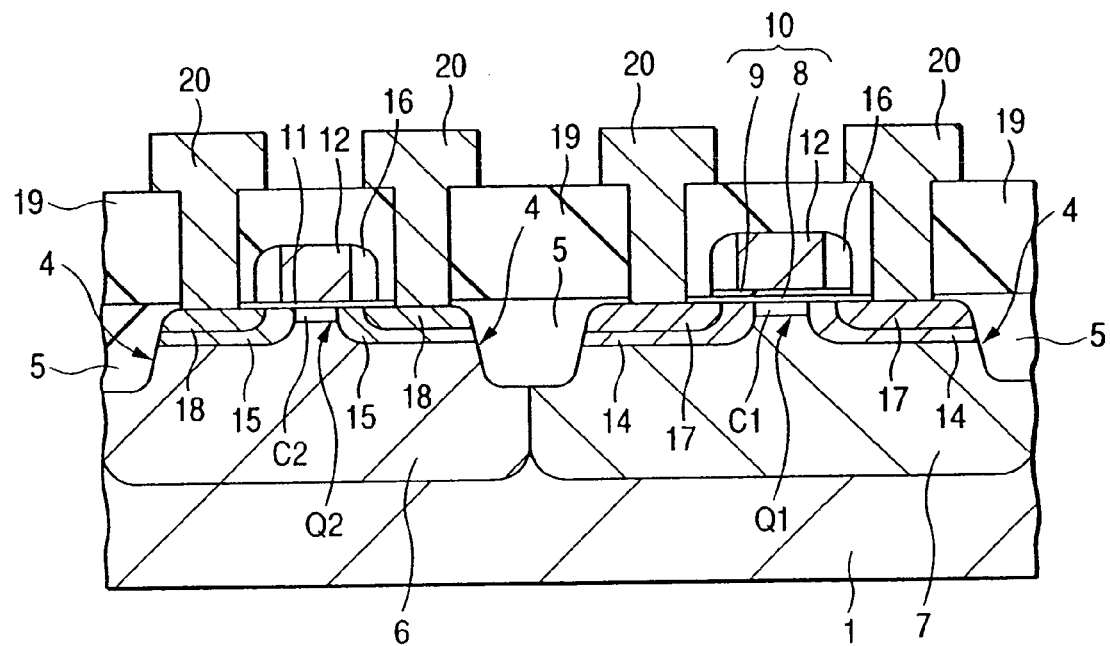
FIG. 2 is a section taken along line A—A of FIG. 1.
Figure 3:
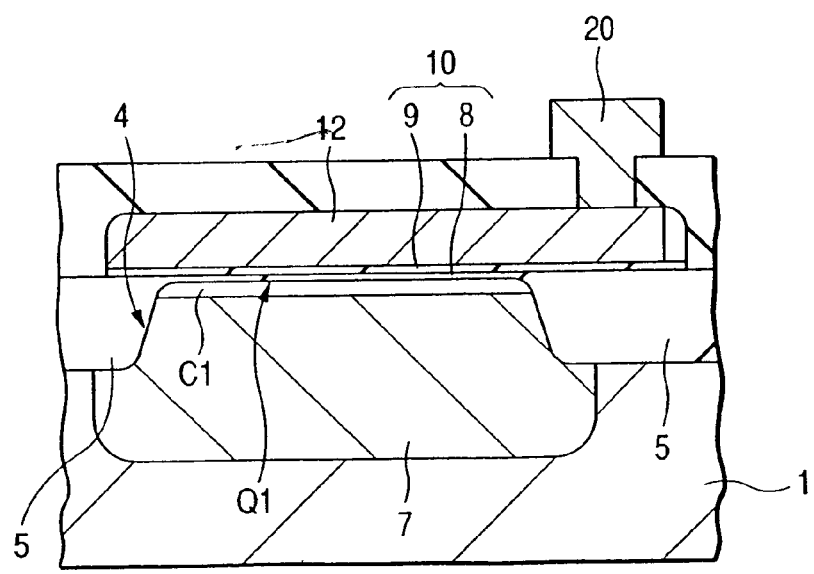
FIG. 3 is a section taken along line B—B of FIG. 1.
Figure 4:
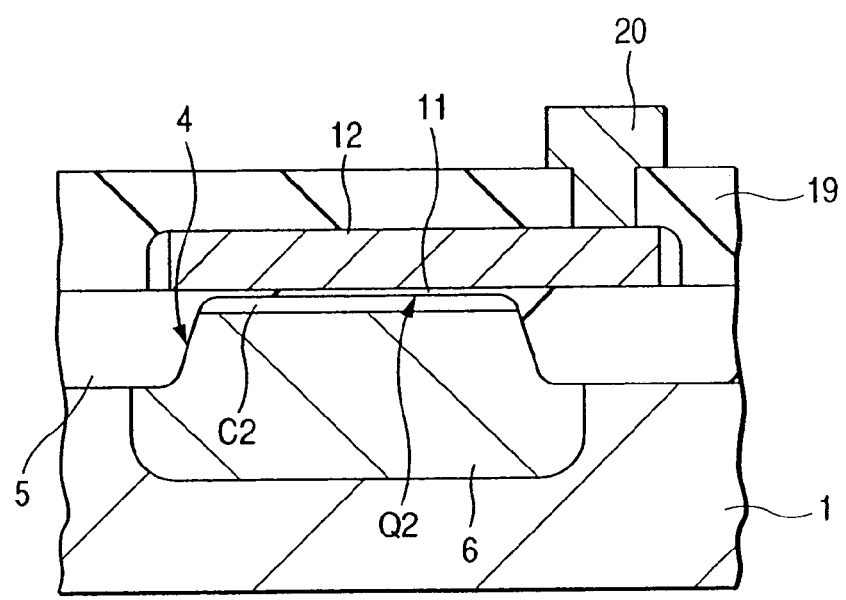
FIG. 4 is a section taken along line C—C of FIG. 1.

FIG. 1 is a schematic top plan view showing two field effect transistors mounted in a semiconductor integrated circuit device of representing an Embodiment 1 according to the invention; FIG. 2 is a section taken along line A—A of FIG. 1; FIG. 3 is a section taken along line B—B of FIG. 1; and FIG. 4 is a section taken along line C—C of FIG. 1. For easy understanding of the illustrations, an interlayer insulating film 19 and a wiring 20, which will be described hereinafter, are omitted from FIG. 1.

As shown in FIGS. 1 and 2, the semiconductor integrated circuit device of this embodiment is mainly constructed so as to have a p-type semiconductor substrate made of single crystalline silicon, for example.

Over the main surface of the p-type semiconductor substrate 1, there are formed a plurality of element forming regions (active regions). These element forming regions are individually defined by grooves 4, which are formed in the element isolating regions of the main surface of the p-type semiconductor substrate 1, and a buried insulating film 5 which is buried in the grooves 4, so that they are insulated and separated from one another.

Of the element forming regions, the first element forming region has an n-type well region 7 formed therein, and the second element forming region has a p-type well region formed therein.

In the first element forming region of the main surface of the semiconductor substrate, there is constructed a field effect transistor Q1 of a p-channel conductivity type. This field effect transistor Q1 is constructed as a p-channel MISFET (Metal Insulator Semiconductor Field Effect Transistor), for example, and is composed mainly of a channel implantation layer C1 for controlling the threshold voltage, a gate insulating film 10, a gate electrode 12, and a pair of p-type semiconductor regions 14 and a pair of p-type semiconductor regions 17, i.e., the source region and the drain regions.

In the field effect transistor Q1, the channel implantation layer C1 is formed in the surface layer of the n-type well region 7 or the channel forming region. The gate insulating film 10 is formed over the n-type well region 7, and the gate electrode 12 is formed over the gate insulating film 10. This gate electrode 12 is made of a polycrystalline silicon film doped with an impurity for reducing the resistance thereof. The paired p-type semiconductor regions 14 are formed in the surface layer of the n-well region 7. These paired p-type semiconductor regions 14 are formed by introducing an impurity into the n-well region 7 in a self-alignment with the gate electrode 12. The paired p-type semiconductor regions 17 are formed in the surface layer of the paired p-type semiconductor regions 14. These paired p-type semiconductor regions 17 are formed by introducing an impurity in the n-well region 7 in self-alignment with a sidewall spacer 16 formed on the side surfaces of the gate-electrode 12 in the gate length direction, at a higher dose than that of the paired p-type semiconductor regions 14.

In the second element forming region of the main surface of the semiconductor substrate, there is constructed a field effect transistor Q2 of an n-channel conductivity type. This field effect transistor Q2 is constructed of an n-channel MISFET, for example, and is composed mainly of a channel implantation layer C2 for controlling the threshold voltage, a gate insulating film 11, a gate electrode 12, and a pair of n-type semiconductor regions 15 and a pair of n-type semiconductor regions 18, serving as the source regions and the drain regions.

In the field effect transistor Q2, the channel implantation layer C2 is formed in the surface layer of the p-type well region 6 or the channel forming region. The gate insulating film 11 is formed over the p-type well region 6, and the gate electrode 12 is formed over the gate insulating film 11. This gate electrode 12 is a polycrystalline silicon film doped with an impurity for reducing the resistance. The paired n-type semiconductor regions 15 are formed in the surface layer of the p-well region 6. These paired p-type semiconductor regions 15 are formed by introducing an impurity in the p-well region 6 in self-alignment with the gate electrode 12. The paired p-type semiconductor regions 18 are formed in the surface layer of the paired n-type semiconductor regions 16. These paired n-type semiconductor regions 18 are formed by introducing an impurity in the p-well region 6 in self-alignment with the side wall spacer 16 formed on the side surfaces of the gate electrode 12 in the gate length direction, with an impurity in a self-alignment manner at a higher dose than that of the paired n-type semiconductor regions 15.

The operating voltage of the field effect transistor Q1 is set at 15 [V], for example, and the thickness of the gate insulating film 10 is set at about 20 [nm]. This gate insulating film 10 is a thermally oxidized film 8 having a thickness of about 3 [nm] and a deposited film 9 having a thickness of about 17 [nm]. The thermally oxidized film 8 is a silicon oxide film formed by oxidizing the main surface of the p-type semiconductor substrate 1. The deposited film 9 is a silicon oxide film formed over the thermally oxidized film 8 by using a CVD (Chemical Vapor Deposition) method, for example.

The operating voltage of the field effect transistor Q2 is set at 1.8 [V], for example, and the thickness of the gate insulating film 11 is set at about 5 [nm]. This gate insulating film 11 is a thermally oxidized film unlike the gate insulating film 10. This thermally oxidized film is a silicon oxide film formed by oxidizing the main surface of the p-type semiconductor substrate 1.

Thus, the gate insulating film 10 of the field effect transistor Q1 is made thicker than the gate insulating film 11 of the field effect transistor Q2. Moreover, the intensity of electric field applied to the field effect transistor Q1 is greater than that applied to the gate insulating film 11 of the field effect transistor Q2.

To the paired p-type semiconductor regions 17 or the source region and the drain region of the field effect transistor Q1, there are electrically connected a first-layer metal wiring 20 through connection holes formed in an interlayer insulating film 19. To the paired n-type semiconductor regions 18 or the source region and the drain region of the field effect transistor Q2, there are electrically connected the first-layer metal wiring 20 through the connection holes formed in the interlayer insulating film 19.

The gate electrode 12 of the field effect transistor Q1 is led out at its two end portions in the gate width direction over the buried insulating film 5, as shown in FIG. 3, and is electrically connected at its one end portion to the first-layer metal wiring 20 through the connection holes formed in the interlayer insulating film 19. The gate electrode 12 of the field effect transistor Q2 is led out at its two end portions in the gate width direction over the buried insulating film 5, as shown in FIG. 4, and is electrically connected at its one end portion to the metal wiring 20 through the connection holes formed in the interlayer insulating film 19.

A method for manufacturing the semiconductor integrated circuit device will be described in the following with reference to FIGS. 5 to 14 (sections for illustrating the manufacturing method).

First, there is prepared the p-type semiconductor substrate 1 which is made of single crystalline silicon, for example. This p-type semiconductor substrate 1 is so formed as to have a resistivity of 10 [Ωcm].

Next, thermal oxidation is executed to form a silicon oxide ($SiO_2$) film 2A all over a main surface of the p-type semiconductor substrate 1.

Figure 5:
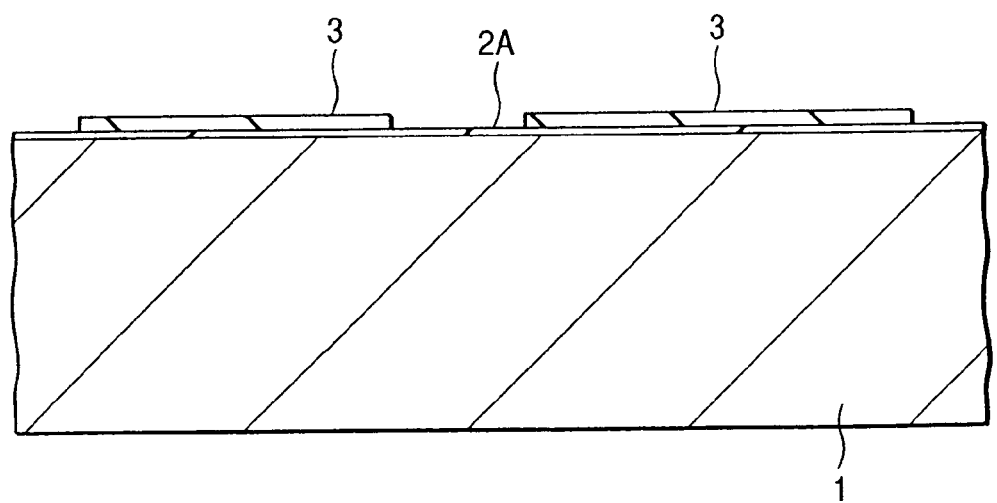
FIG. 5 is a section for illustrating a method for manufacturing the semiconductor integrated circuit device.

Next, a mask 3 of a silicon nitride (SiN) film is selectively formed over the silicon oxide film 2A confronting the first element forming region and the second element forming region of the main surface of the p-type semiconductor substrate 1. The manufacturing steps up to this point are shown in FIG. 5.

Figure 6:
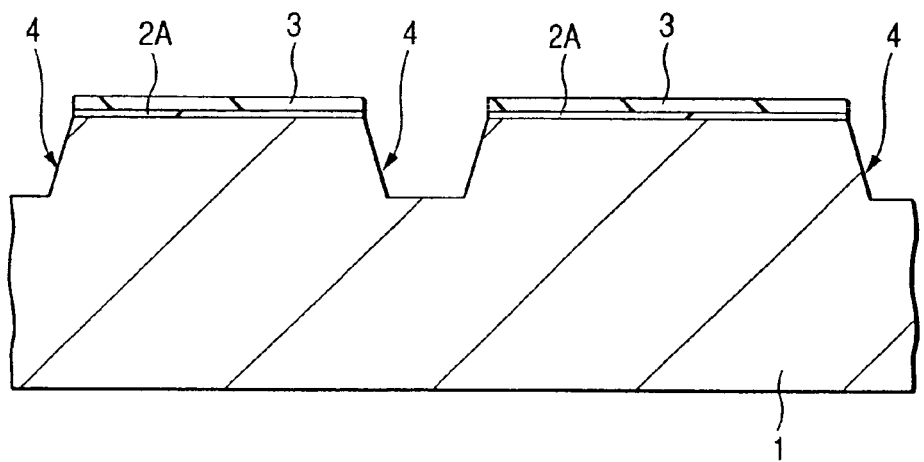
FIG. 6 is a section for illustrating the method for manufacturing the semiconductor integrated circuit device.

Next, the mask 3 is used as the etching mask to etch the silicon oxide film 2A and the element isolating regions of the main surface of the p-type semiconductor substrate 1 thereby to form the grooves 4 defining the first element forming region and the second element forming region. This etching treatment is executed by an anisotropic dry etching such as RIE (Reactive Ion Etching). The grooves 4 are so formed as to have a depth of about 0.3 [μm]. The manufacturing steps up to this point are shown in FIG. 6.

Next, thermal oxidation is executed to oxidize the inner faces of the grooves 4 to form a silicon oxide film (not shown). This thermal oxidation is intended to eliminate the crystal defects which occur at the time of making the grooves 4.

Figure 7:
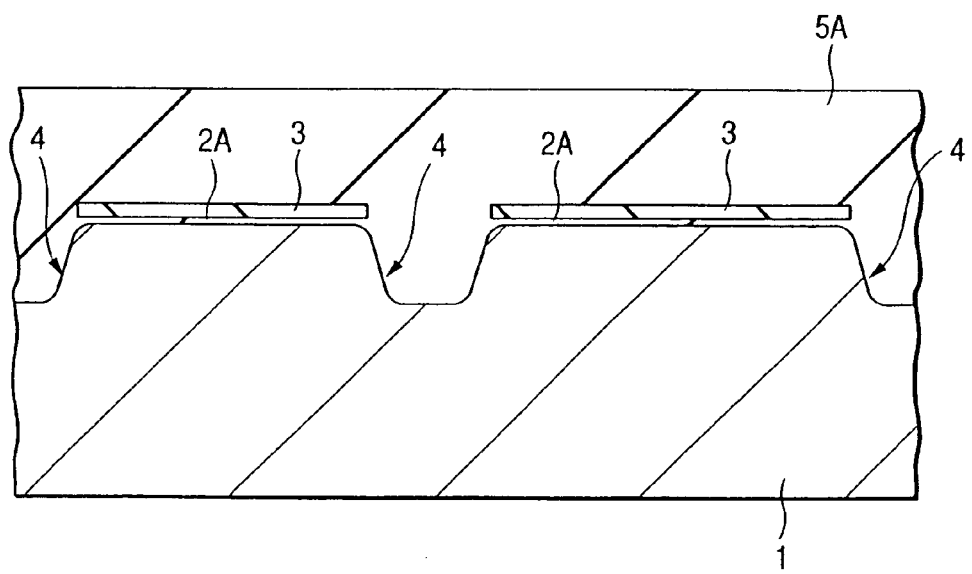
FIG. 7 is a section for illustrating the method for manufacturing the semiconductor integrated circuit device.

Next, a silicon oxide film 5A is so formed all over the p-type semiconductor substrate 1 by an LPCVD (Low Pressure CVD) method as to fill in the grooves 4. The manufacturing steps up to this point are shown in FIG. 7.

Next, the silicon oxide film 5A over the main surface of the p-type semiconductor substrate 1 is removed by a CMP (Chemical Mechanical Polishing) method, for example, to form the buried insulating film 5 in the grooves 4. At this step, the mask 3 is used as a stopper at the chemical mechanical polishing time.

Next, heat treatment is executed to density the buried insulating film 5. This heat treatment is performed in an oxidizing atmosphere or in an atmosphere of an inert gas. By this densification, the etching rate of the buried insulating film 5 approaches that of the thermally oxidized film.

Next, the mask 3 is removed by a wet etching method using a hot aqueous solution of phosphoric acid, and the silicon oxide film 2A left over the first element forming region and the second element forming region of the main surface of the p-type semi-conductor substrate 1 is removed by a wet etching method using an aqueous solution of hydrofluoric acid. By this step, the first element forming region and the second element forming region are individually insulated and isolated (electrically isolated) by the grooves 4 formed in the element isolating regions of the main surface of the p-type semiconductor substrate 1 and the buried insulating film 5 buried in the grooves 4.

Next thermal oxidation is executed, for example, to form an impurity introducing buffer insulating film 2B, which is a silicon oxide film having a thickness of about 10 [nm], is formed over the first element forming region and the second element forming region of the main surface of the p-type semiconductor substrate 1.

Figure 8:
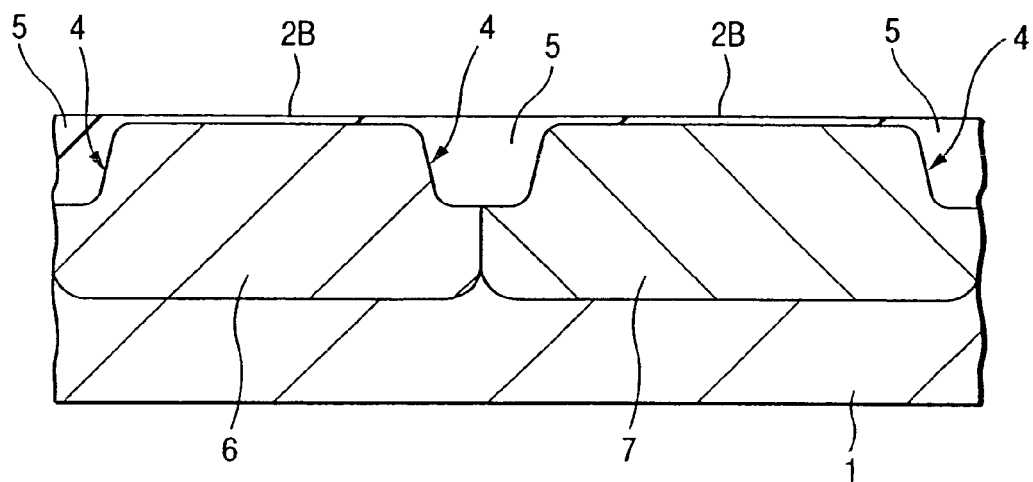
FIG. 8 is a section for illustrating the method for manufacturing the semiconductor integrated circuit device.

Next, the second element forming region of the main surface of the p-type semiconductor substrate 1 is selectively doped with an impurity (e.g., boron (B)), by an ion implantation method, to form the p-type well region 6. After this, the first element forming region of the main surface of the p-type semiconductor substrate 1 is doped with an impurity (e.g., phosphor (P)) by an ion implantation method, to form the n-type well region 7. The manufacturing steps up to this point are shown in FIG. 8.

Figure 9:
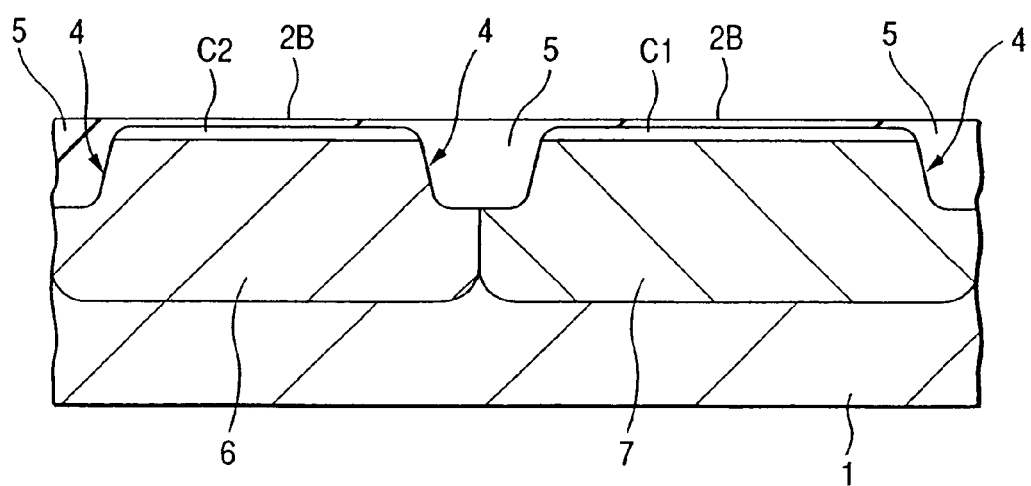
FIG. 9 is a section for illustrating the method for manufacturing the semiconductor integrated circuit device.

Next, the surface layer of the p-type well region 6 is selectively doped with an impurity by an ion implantation method, to form the channel implantation layer C2 for controlling the threshold voltage. After this, the surface layer of the n-type well region 7 is selectively doped with an impurity by an ion implantation method, to form the channel implantation layer C1 for controlling the threshold voltage. The manufacturing steps up to this point are shown in FIG. 9.

Next, the buffer insulating film 2B is removed by a wet etching method using an aqueous solution of hydrofluoric acid, to expose the surfaces of the first element forming region and the second element forming region of the main surface of the p-type semiconductor substrate 1 to the outside.

Next, thermal oxidation is executed to form the thermally oxidized film 8 having a thickness of about 3 [nm] over the first element forming region and the second element forming region of the main surface of the p-type semiconductor substrate 1. This thermal oxidation is performed by a dry oxidizing method capable of controlling the thickness of the film to a small value and forming an oxide film of high quality.

Figure 10:
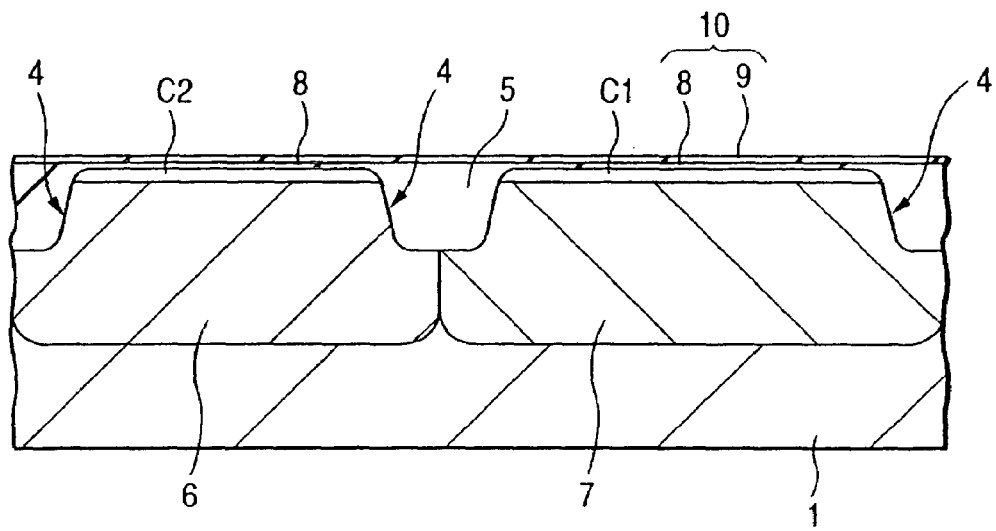
FIG. 10 is a section for illustrating the method for manufacturing the semiconductor integrated circuit device.

Next, a chemical vapor deposition method is used to form the thermally oxidized film 8. Just after this, the deposited film 9 of a silicon oxide film having a thickness of about 17 [nm] is formed all over the surface of the p-type semiconductor substrate 1 including the thermally oxidized film 8 and the buried insulating film 5. By this step, the gate insulating film 10, i.e., the thermally oxidized film 8 and the deposited film 9, is formed over the first element forming region. The manufacturing steps up to this point are shown in FIG. 10.

Figure 11:
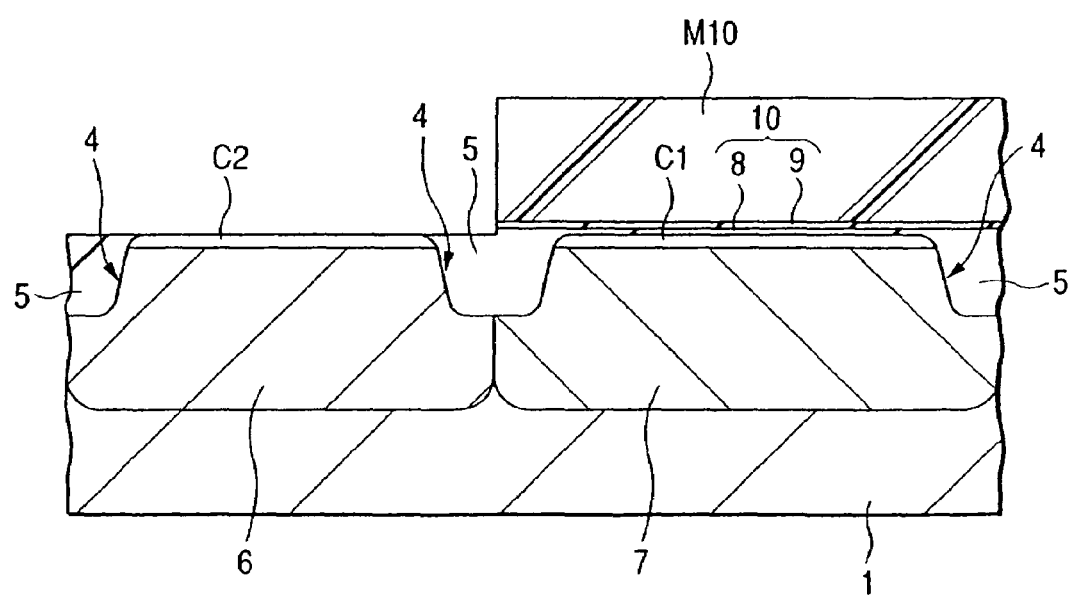
FIG. 11 is a section for illustrating the method for manufacturing the semiconductor integrated circuit device.
Figure 12:
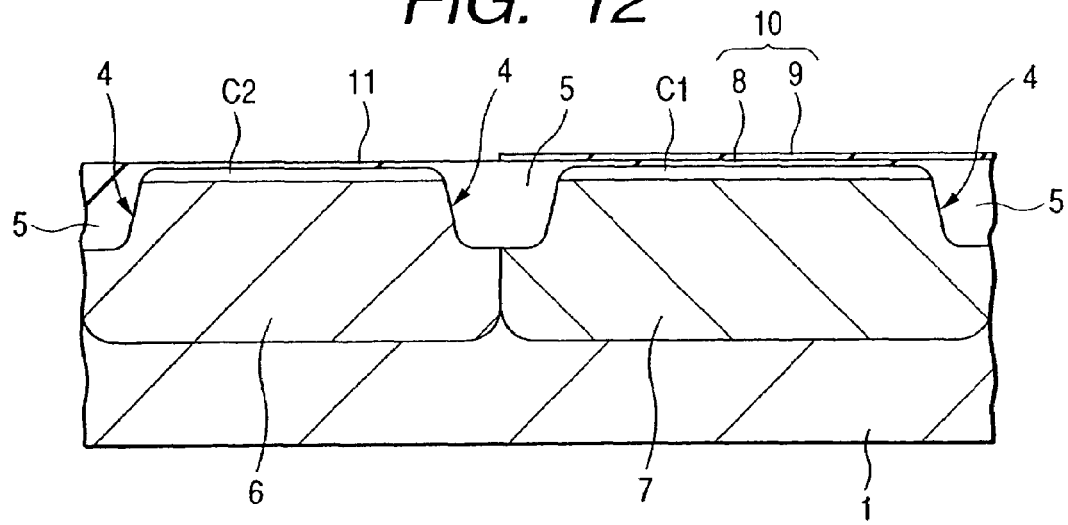
FIG. 12 is a section for illustrating the method for manufacturing the semiconductor integrated circuit device.

Next, there is formed a mask M10 which covers the first element forming region of the main surface of the p-type semiconductor substrate 1 while leaving the second element forming region open. This mask M10 is formed by a photolithographic technique using a photoresist film. The end portions of the mask M10 are positioned over the buried insulating film 5, for example, as shown in FIGS. 1 and 11.

Next, the mask M10 is used to wet-etch off the deposited film 9 and the thermally oxidized film 8 over the second element forming region of the main surface of the p-type semiconductor substrate 1. At this step, the buried insulating film 5 is not etched off until the deposited film 9 is removed, because it is covered with the deposited film 9 in an ordinary wet etching, at least 10% of the film thickness is etched off. When the film to be etched has a thickness of 20 [nm], therefore, the etched amount is 22 [nm]. In the prior art, a step of 22 [nm] is formed in the end portions of the element isolating regions between the second element forming region and the element isolating regions. In this embodiment, however, the buried insulated film 5 is not etched until the deposited film 9 is removed, so that the step can be reduced to 5 [nm]. By covering the buried insulating layer 5 with the deposited film 9, more specifically, the etched amount of the buried insulating film 5 can be reduced to an amount corresponding to the thickness of the deposited film 9. The manufacturing steps up to this point are shown in FIG. 11.

Next, the mask M10 is ashed off, and thermal oxidation is executed by a dry-oxidation method to form the gate insulating film 11, which is a thermally oxidized film having a thickness of about 5 [nm], over the second element forming region of the main surface of the p-type semiconductor substrate 1. At this step, an extremely thin thermally oxidized film is formed between the first element forming region of the main surface of the p-type semiconductor substrate 1 and the thermally oxidized film 8. By this step, there are formed the gate insulating film 10 and the gate insulating film 11 which have different thicknesses. By this thermal oxidation, moreover, the deposited film 9 is densified. The heat treatment to densify the deposited film 9 may be added at another step. This heat treatment is executed in an inert or oxidizing atmosphere, for example. This makes it possible to improve the film quality of the gate insulating film 10.

Next, all over the p-type semiconductor substrate 1 over the gate insulating film 11 and the gate insulating film 10, there is formed by a chemical vapor deposition method a polycrystalline silicon film which has a thickness of about 200 [nm] and an impurity concentration of about $4 \times 10^{20}$ [atoms/cm$^3$]. After this, a silicon oxide film 14 having a thickness of about 50 [nm] is formed all over the polycrystalline silicon film by a chemical vapor deposition method.

Next, the silicon oxide film 13 and the polycrystalline silicon film are individually patterned sequentially to form the gate electrode 12 over the gate insulating film 11 and the gate electrode 12 over the gate insulating film 10. These gate electrodes 12 are so formed that their two end portions in the gate width direction are led out over the buried insulating film 5.

Next, the first element forming region of the main surface of the p-type semiconductor substrate 1 is selectively doped with an impurity of boron by an ion implantation method and is then subjected to a heat treatment at 900[° C.] for 20 minutes to form the paired p-type semiconductor regions 14 which are the source region and the drain region. This boron implantation is executed under the conditions of the final dosage of about $1 \times 10^{13}$ [atoms/cm$^2$] and the implantation energy of 50 [KeV]. The paired p-type semiconductor regions 14 are formed in self-alignment with the gate electrode 12 and the buried insulating film 5.

Figure 13:
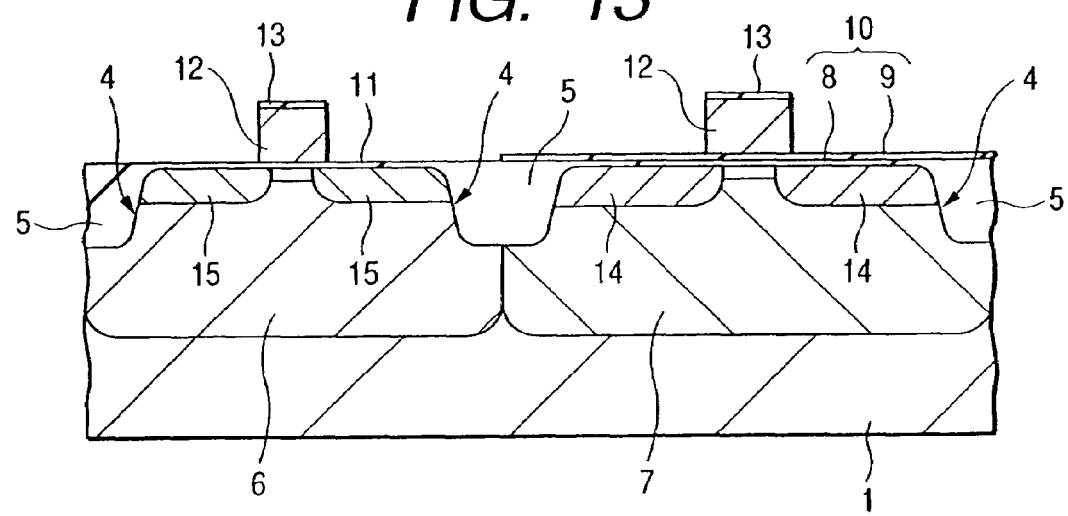
FIG. 13 is a section for illustrating the method for manufacturing the semiconductor integrated circuit device.

Next, the second element forming region of the main surface of the p-type semiconductor substrate 1 is selectively doped with an impurity of phosphor by an ion implantation method to form the paired n-type semiconductor regions 15 which are the source region and the drain region. This phosphor implantation is executed under, the conditions of the final dosage of $7\times10^{12}$ [atoms/cm$^2$] and the implantation energy of 60 [KeV]. The paired n-type semiconductor regions 14 are formed in self-alignment with the gate electrode 12 and the buried insulating film 5. The manufacturing steps up to this point are shown in FIG. 13.

Next, there are formed the side wall spacers 16 for covering the side faces of the gate electrode 12. The side wall spacers 16 are formed, for example, by forming an insulating film of a silicon oxide film all over the p-type, semiconductor substrate 1 by a CVD method and then by anisotropically etching the insulating film by a RIE method.

Next, the first element forming region of the main surface of the p-type semiconductor substrate 1 is selectively doped with an impurity of boron by an ion implantation method, to form the paired p-type semiconductor regions 17 which are the source region and the drain region. These paired p-type semiconductor regions 17 are formed in self-alignment with the side wall spacers 16 and the buried insulating film 5. At this step, the field effect transistor Q1 is substantially completed.

Figure 14:
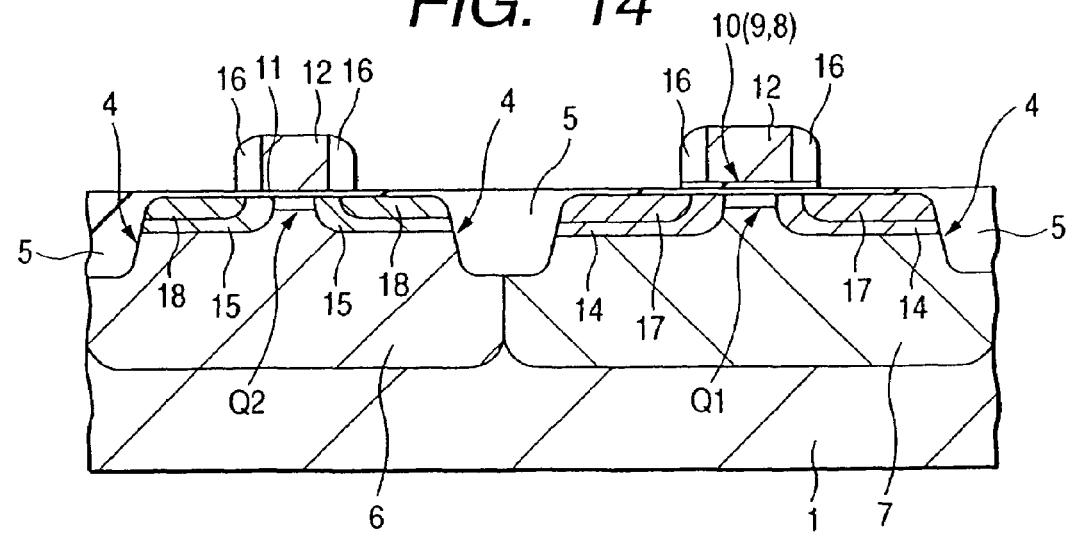
FIG. 14 is a section for illustrating the method for manufacturing the semiconductor integrated circuit device.

Next, the second element forming region of the main surface of the n-type semiconductor substrate 1 is selectively doped with an impurity of phosphor or arsenic (As) by an ion implantation method, to form the paired n-type semiconductor regions 18 which are the source region and the drain region. These paired n-type semiconductor regions 18 are formed in self-alignment with the side wall spacers 16 and the buried insulating film 5. At this step, the field effect transistor Q2 is substantially completed. The manufacturing steps up to this point are shown in FIG. 14.

Next, the interlayer insulting film 19 is formed all over the main surface of the p-type semiconductor substrate 1. After this, the connection holes are formed in the interlayer insulating film 19, and the first-layer wiring 20 is formed over the interlayer insulating film 19, thus establishing the state shown in FIGS. 2, 3 and 4.

Thus, the following operations and effects can be achieved in this embodiment.

There is provided a method for manufacturing a semiconductor integrated circuit device including a field effect transistor Q1 having the gate insulating film 10 formed over the first element forming region of the main surface of the p-type semiconductor substrate 1 and the field effect transistor Q2 having the gate insulating film 11 formed over the second element forming region of the main surface of the p-type semiconductor substrate 1 and made thinner than the gate insulating film 10 of the field effect transistor Q1, comprising the steps of forming the thermally oxidized film 8 over the first element forming region and the second element forming region of the main surface of the p-type semiconductor substrate 1; subsequently forming the deposited film 9 over the main surface of the p-type semiconductor substrate 1 including the thermally oxidized film 8; subsequently removing the deposited film 9 and the thermally oxidized film 8 from over the second element forming region; and subsequently forming the thermally oxidized film over the second element forming region to form the gate insulating film 10 and the gate insulating film 11 of different thicknesses. The first element forming region and the second element forming region are insulated and isolated by the grooves 4, which are formed in the element isolating regions of the main surface of the p-type semiconductor substrate 1, and the buried insulating film 5 which is buried in the grooves 4.

Thanks to this construction, when the deposited film 9 and the thermally oxidized film 8 are removed from over the second element forming region, the buried insulating film 5 is not etched until the deposited film 9 is removed, because it is covered with the deposited film 9, so that the etched amount of the buried insulating film 5 can be reduced to an extent corresponding to the thickness of the deposited film 9. Thus, the step formed at the end portions of the element isolating regions between the second element forming region and the element isolating region can be reduced to avoid the deterioration of the gate breakdown voltage and the characteristic variation, which light otherwise be caused by the step, of the field effect transistor. As a result, it is possible to enhance the reliability of the semiconductor integrated circuit device.

As the ratio of the thickness of the deposited film 9 to the thickness of the gate insulating film 10 formed over the first element forming region is made larger, the thermally oxidized film 8 formed over the second element forming region becomes thinner, so that the etched amount of the buried insulating film 5 can be reduced. This etched amount of the buried insulating film 5 is increased in proportion to the thickness of the thermally oxidized film 8.

Moreover, the gate insulating film 10 formed over the first element forming region is made of the thermally oxidized film 8 and the deposited film 9, and the gate insulating film 11 formed over the second element forming region is made of the thermally oxidized film. As a result, the buried insulating film 5 can be covered with the deposited film 9, so that the etched amount of the buried insulating film 5 can be reduced.

This embodiment has been described, taking the case in which the thermally oxidized film 8 is formed over the first element forming region and the second element forming region and the deposited film 9 is then formed all over the substrate including the thermally oxidized film 8. However, the thermally oxidized film 8 may be eliminated, and the deposited film 9 may be formed directly over the first element forming region. The deposited film formed by a chemical vapor deposition method has a worse film quality (film quality of the interface between the deposited film and the substrate) than that of the thermally oxidized film, so that a leakage current is liable to fluid, when the thermally oxidized film or the gate insulating film 10 is formed over the second element forming region, however, the thermally oxidized film 8 is also formed between the first element forming region (the substrate 1) and the deposited film 9, so that the generation of the leakage current can be suppressed by the thermally oxidized film. The thickness of the thermally oxidized film formed between the first element forming region and the deposited film 9 depends upon the time period for the thermal oxidation when the thermally oxidized film or the gate insulating film 10 is formed over the second element forming region. A gate insulating film causing little leakage current can be formed depending upon the thickness of the thermally oxidized film for over the second element forming region. Therefore the gate insulating film 11 and the gate insulating film 10 of different thicknesses may be formed by forming the deposited film 9 all over the substrate including the first element forming region and the second element forming region, by subsequently removing the deposited film 9 from over the second element forming region, and by subsequently forming the thermally oxidized film over the second element forming region. In this case, the number of manufacturing steps can be reduced to an extent corresponding to the omission of the thermally oxidized film 8. Moreover, the etched amount of the buried insulating film 5 can be further lowered because only the deposited film 9 may be removed from over the second element forming region.

This invention has been described, taking the case in which the buried insulating film 5 is formed in the grooves 4 by a chemical mechanical polishing (CMP) method. However, the buried insulating film 5 may be formed by an etching-back method.

[Embodiment 2]

This embodiment will be described, taking the case in which the invention is applied to a semiconductor integrated circuit device including three kinds of field effect transistors having gate insulating films of different thicknesses.

Figure 15:
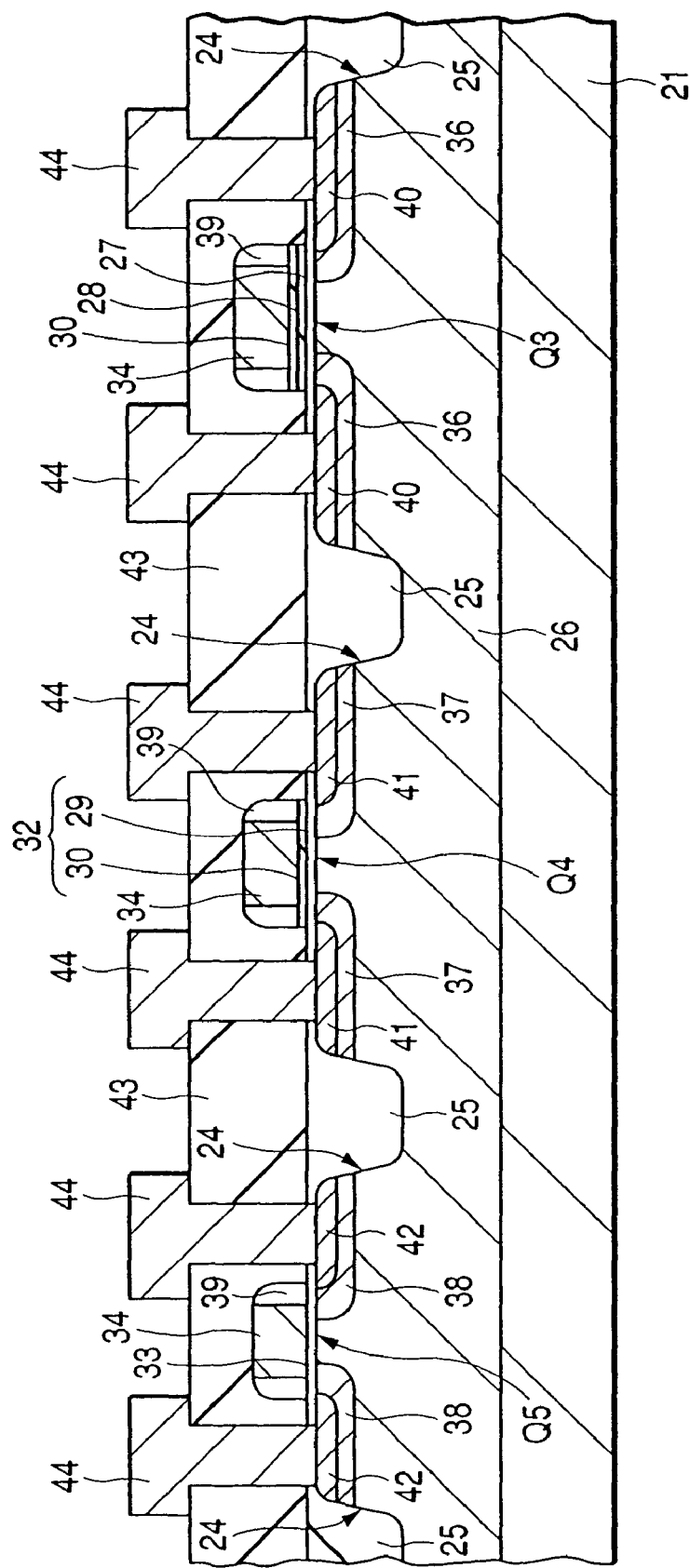
FIG. 15 is a section showing three field effect transistors mounted in a semiconductor integrated circuit device representing an Embodiment 2 according to the invention.

FIG. 15 is a section showing a construction of the three field effect transistors mounted in the semiconductor integrated circuit device of Embodiment 2 according to the invention.

As shown in FIG. 15, the semiconductor integrated circuit device of this embodiment is constructed mainly of a p-type semiconductor substrate 21 made of single crystalline silicon.

Over the main surface of the p-type semiconductor substrate 21, there are formed a first element forming region, a second element forming region and a third element forming region. These first, second and third element forming regions are individually defined by grooves 24, which are formed in the element isolating regions of the main surface of the p-type semiconductor substrate 21, and a buried insulating film 25 buried in the grooves 24, so that they are insulated and isolated (electrically isolated) from one another.

In the first, second and third element forming regions forming regions, there is formed a p-type well region 26.

In the first element forming region, there is a field effect transistor Q3 of the n-channel conductivity type. This field effect transistor Q3 is constructed as an n-channel MISFET, for example, and is composed mainly of a p-type well region 26 to serve as a channel forming region, a gate insulating film 31, a gate electrode 34, and a pair of n-type semiconductor regions 36 and a pair of n-type semiconductor regions 40 which are the source regions and the drain regions. The impurity concentration of the n-type semiconductor region 40 is higher than that of the n-type semiconductor region 36. The thickness of the gate insulating film 31 of the field effect transistor Q3 is about 25 [nm]. The gate insulating film 31 is made of a thermally oxidized film 27, a deposited film 28 and a deposited film 30.

In the second element forming region, there is constructed a field effect transistor Q4 of the n-channel conductivity type. This field effect transistor Q4 is constructed as an n-channel MISFET, for example, and is composed mainly of a p-type well region 26 to serve as a channel forming region, a gate insulating film 32, a gate electrode 34, and a pair of n-type semiconductor regions 37 and a pair of n-type semiconductor regions 41 which are the source regions and the drain regions. The impurity concentration of the n-type semiconductor region 41 is higher than that of the n-type semiconductor region 37. The thickness of the gate insulating film 32 of the field effect transistor Q4 is about 12 [nm]. The gate insulating film 32 is made of a thermally oxidized film 29, a deposited film 29 and a deposited film 30.

In the third element forming region, there is constructed a field effect transistor Q5 of the n-channel conductivity type. This field effect transistor Q5 is constructed as an n-channel MISFET, for example, and is composed mainly of a p-type well region 26 to serve as a channel forming region, a gate insulating film 33, a gate electrode 34, and a pair of n-type semiconductor regions 38 and a pair of n-type semiconductor regions 42 which are the source regions and the drain regions. The impurity concentration of the n-type semiconductor region 42 is higher than that of the n-type semiconductor region 38. The thickness of the gate insulating film 33 of the field effect transistor Q5 is about 4 [nm]. The gate insulating film 33 is made of a thermally oxidized film.

Thus, the gate insulating film 31 of the field effect transistor Q3 is made thicker than the gate insulating film 32 of the field effect transistor Q4, and this gate insulating film 32 of the field effect transistor Q4 is made thicker than the gate insulating film 33 of the field effect transistor Q5. Moreover, the intensity of electric field applied to the gate insulating film 31 of the field effect transistor Q3 is greater than that applied to the gate insulating film 32 of the field effect transistor Q4, and the intensity of electric field applied to the gate insulating film 33 of the field effect transistor Q4 is greater than that applied to the gate insulating film 33 of the field effect transistor Q5.

Next, a method for manufacturing the semiconductor integrated circuit device will be described with reference to FIGS. 16 to 22 (sections for illustrating the manufacturing method).

First, there is prepared the p-type semiconductor substrate 21 which is made of single crystalline silicon, for example.

Next, the grooves 24 are formed in the element isolating regions of the main surface of the semiconductor substrate 21 by using the method used in the foregoing Embodiment 1, and the buried insulating film 25 is formed in the grooves 24 to insulate and isolate the first element forming region, the second element forming region and the third element forming region of the main surface of the p-type semiconductor substrate 21 from one another.

Figure 16:
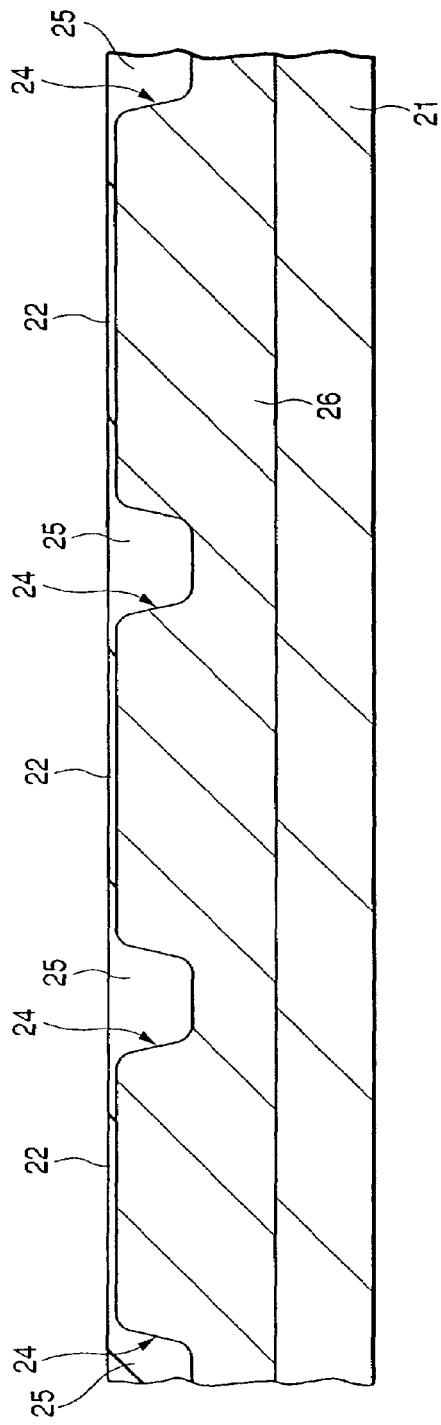
FIG. 16 is a section for illustrating a method for manufacturing the semiconductor integrated circuit device.

Next, a buffer insulating film 22 for introducing an impurity is formed over the first element forming region, the second element forming region and the third element forming region, and the n-type well region 26 is then formed in the first, second and third element forming regions. The manufacturing steps up to this point are shown in FIG. 16.

Next, the buffer insulating film 22 is removed by a wet-etching method using an aqueous solution of hydrofluoric acid to expose the surfaces of the first element forming region, the second element forming region and the third element forming region of the main surface of the p-type semiconductor substrate 21 to the outside.

Next, thermal oxidation is executed by a dry oxidation method to form the thermally oxidized film 27 having a thickness of about 5 [nm] over the first, second and third element forming regions of the main surf ace of the p-type semiconductor substrate 21.

Figure 17:
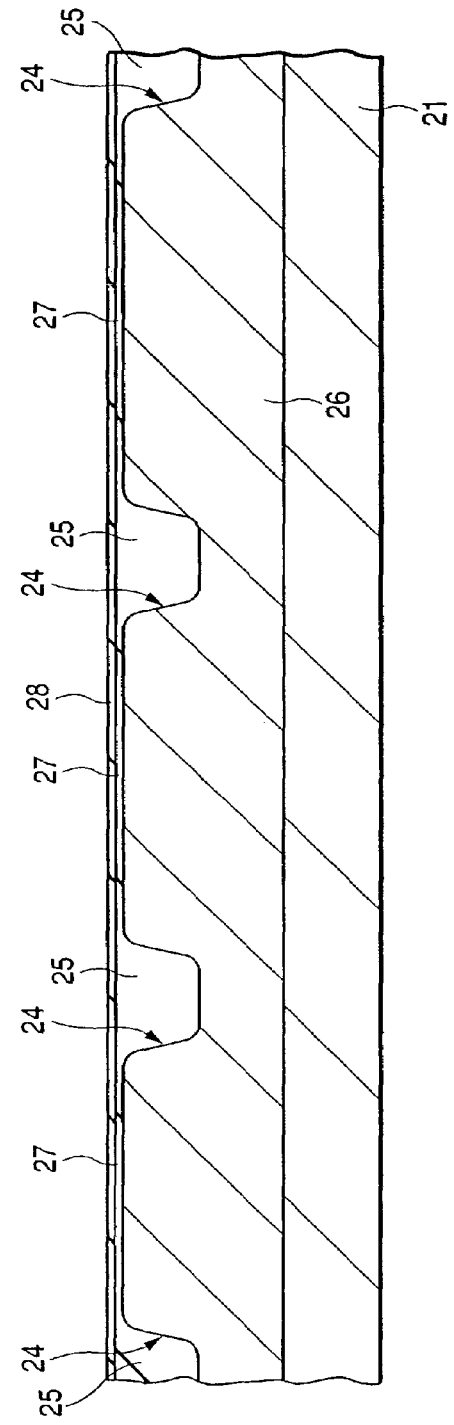
FIG. 17 is a section for illustrating the method for manufacturing the semiconductor integrated circuit device.
Figure 18:
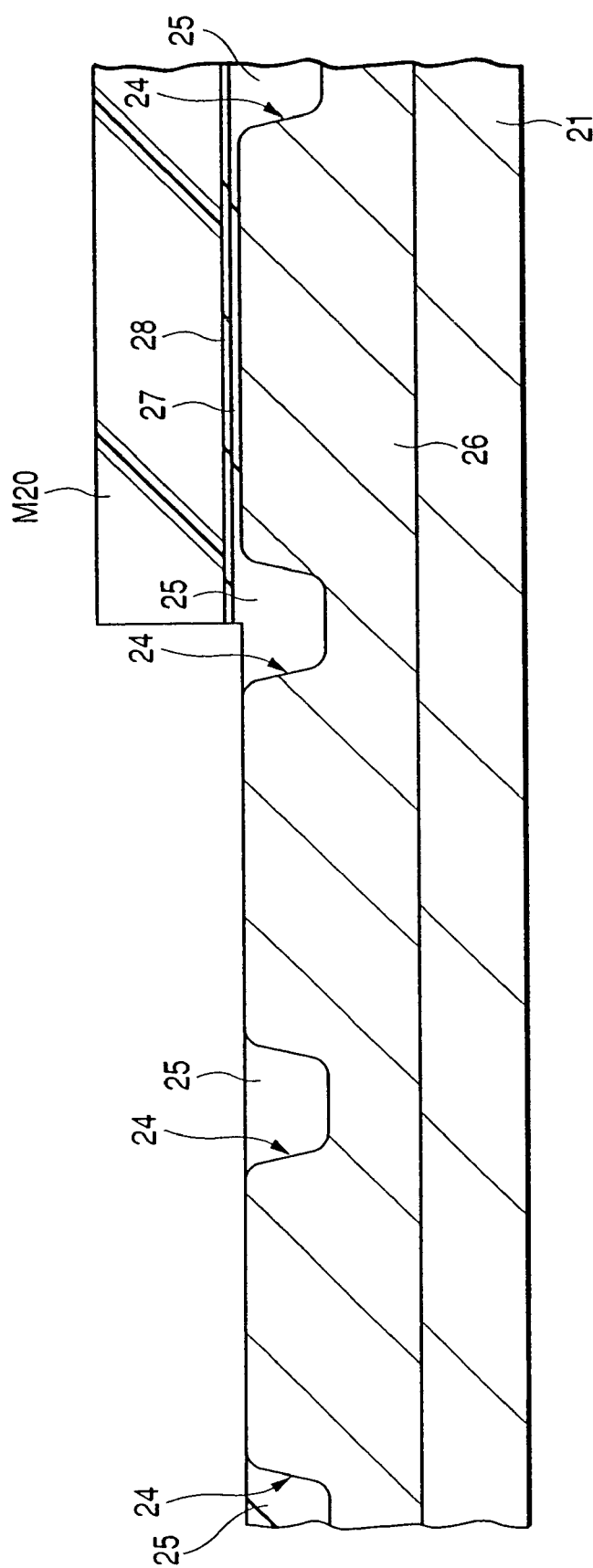
FIG. 18 is a section for illustrating the method for manufacturing the semiconductor integrated circuit device.

Next, a chemical vapor deposition method is used to form the thermally oxidized film 27. Just after this, the deposited film 28 of a silicon oxide film having a thickness of about 13 [nm] is formed all over the surface of the p-type semiconductor substrate 21 including the thermally oxidized film 27 and the buried insulating film 25. The manufacturing steps up to this point are shown in FIG. 17.

Next, there is formed a mask M20 which covers the first element forming region of the main surface of the p-type semiconductor substrate 1 while leaving the second and third element forming regions open. This mask M20 is formed by the photolithographic technique using a photoresist film. The end portions of the mask M20 is positioned over the buried insulating film 25.

Next, the mask M20 is used to wet-etch off the deposited film 28 and the thermally oxidized film 27 over the second third element forming regions of the main surface of the p-type semiconductor substrate 21. At this step, the buried insulating film 25 is not etched off until the deposited film 28 is removed, because it is covered with the deposited film 28.

Next, the mask M20 is ashed off, and thermal oxidation is then executed by a dry-oxidation method to form the thermally oxidized film 29 having a thickness of about 5 [nm] over the second and third element forming regions of the main surface of the p-type semiconductor substrate 21. At this thermally oxidation step, the deposited film 28 is densified to improve its film quality. Moreover, an extremely thin thermally oxidized film is formed between the first element forming region of the main surface of the p-type semiconductor substrate 21 and the thermally oxidized film 27.

Figure 19:
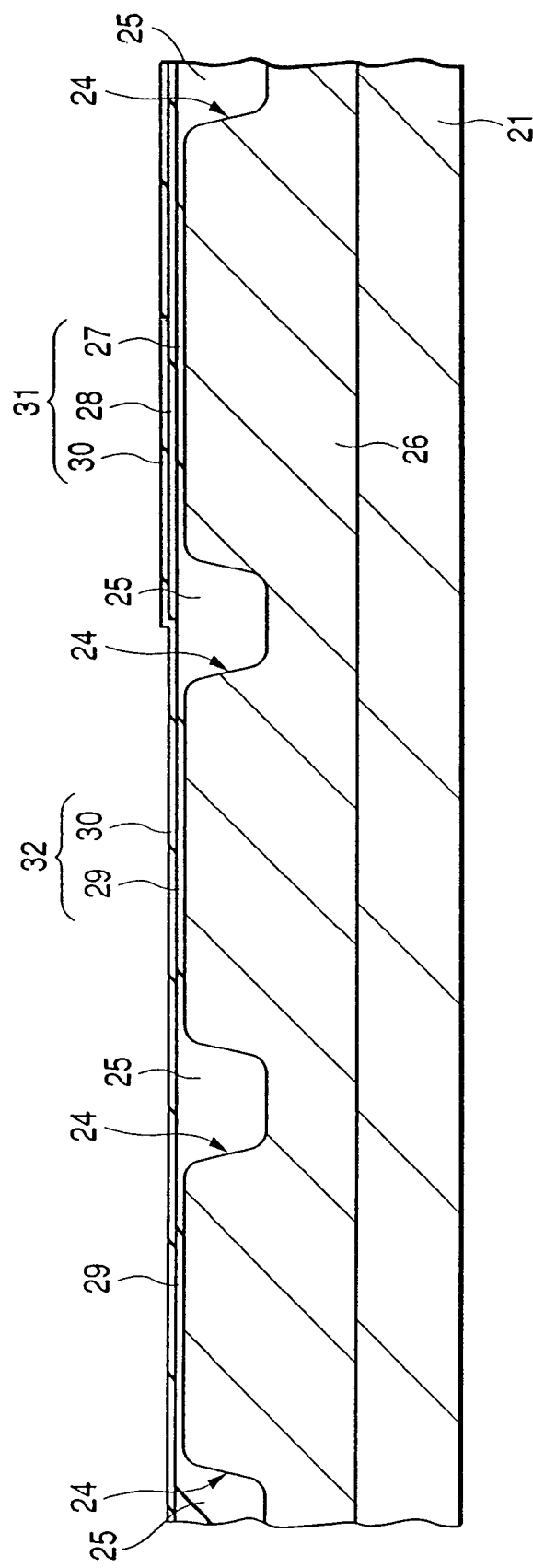
FIG. 19 is a section for illustrating the method for manufacturing the semiconductor integrated circuit device.

Next, a chemical vapor deposition method is used to form the thermally oxidized film 29. Immediately after this, the deposited film 30 of a silicon oxide film having a thickness of about 7 [nm] is formed all over the p-type semiconductor substrate 21 including the deposited film 28, the thermally oxidized film 29 and the buried insulating film 25. At this step, the gate insulating film 31 including the thermally oxidized film 27, the deposited film 28 and the deposited film 30 is formed over the first element forming region, and the gate insulating film 32 including the thermally oxidized film 29 and the deposited film 30 is formed over the second element forming region. The manufacturing steps up to this point are shown in FIG. 19.

Next, a mask M21 is formed to cover the first and second element forming regions of the main surface of the p-type semiconductor substrate 21 while leaving the third element forming region open. This mask M21 is formed by a photolithographic technique using a photoresist film. The mask M21 is so formed that its end portions are positioned over the buried insulating film 25.

Figure 20:
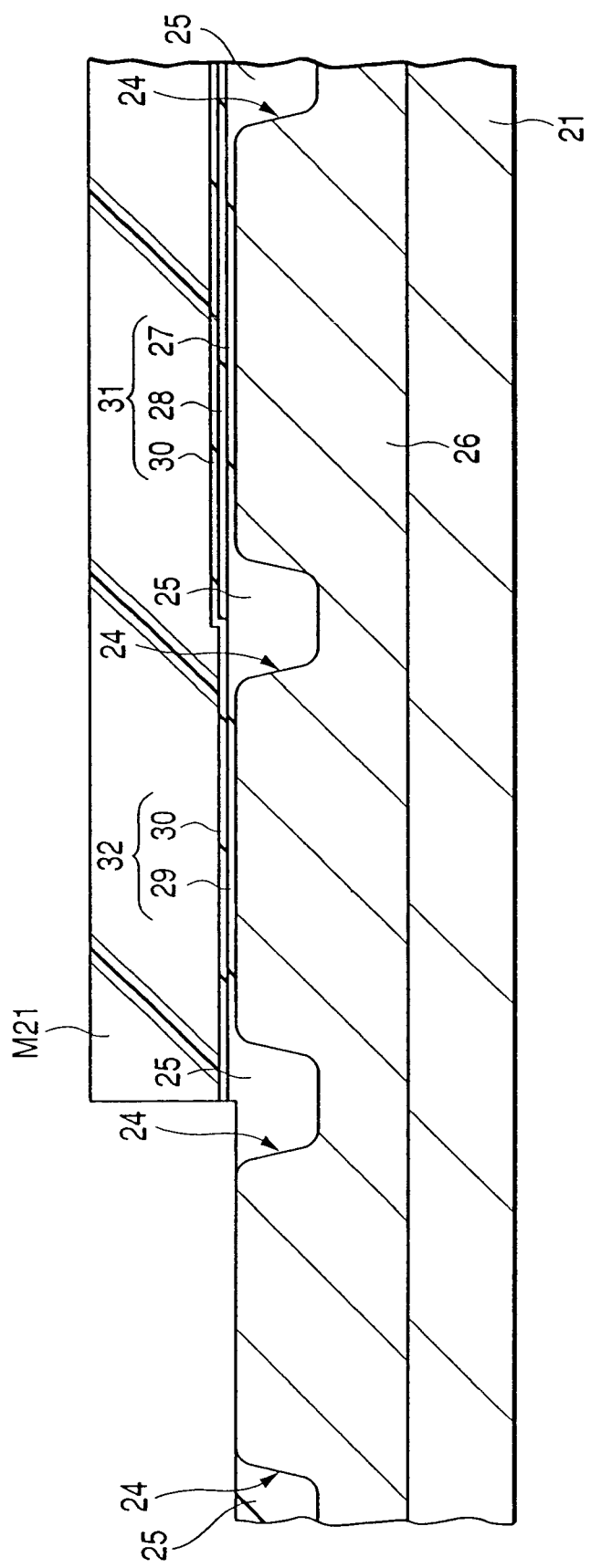
FIG. 20 is a section for illustrating the method for manufacturing the semiconductor integrated circuit device.

Next, the mask M21 is used as the etching mask to remove the deposited film 30 and the thermally oxidized film 29 from over the third element forming region of the main surface of the p-type semiconductor substrate 21 by a wet-etching method. At this step, the buried insulating film 25 is not etched off until the deposited film 30 is removed, because it is covered with the deposited film 30. The manufacturing steps up to this point are shown in FIG. 20.

Next, the mask M21 is ashed off, and thermal oxidation is executed by a dry-oxidation method to form the gate insulating film 33 of a thermally oxidized film having a thickness of about 4.5 [nm] over the third element forming region of the main surface of the p-type semiconductor substrate 21. At this step, an extremely thin thermally oxidized film is formed between the first element forming region and the thermally oxidized film 27 and between the second element forming region and the thermally oxidized film 29. Moreover, the deposited film 28 and the deposited film 30 are densified to improve their film qualities. At this step, there are formed the gate insulating films 31, 32 and 33 having the different thicknesses.

Next, a polycrystalline silicon film having a thickness of about 200 [nm] and an impurity concentration of about $4 \times 10^{20}$ [atoms/cm$^3$] is formed by a chemical vapor deposition method all over the p-type semiconductor substrate 21 including the gate insulating film 31, the gate insulating film 32 and the gate insulating film 33. After this, a silicon oxide film 35 having a thickness of about 50 [nm] is formed by a chemical vapor deposition method all over the polycrystalline silicon film.

Next, the silicon oxide film 35 and the polycrystalline silicon film are individually patterned sequentially to form the gate electrodes 34 over the gate insulating film 31, the gate insulating film 32 and the gate insulating film 33. These gate electrodes 34 are so formed that their two end portions in the gate width direction are led out over the buried insulating film 25.

Figure 21:
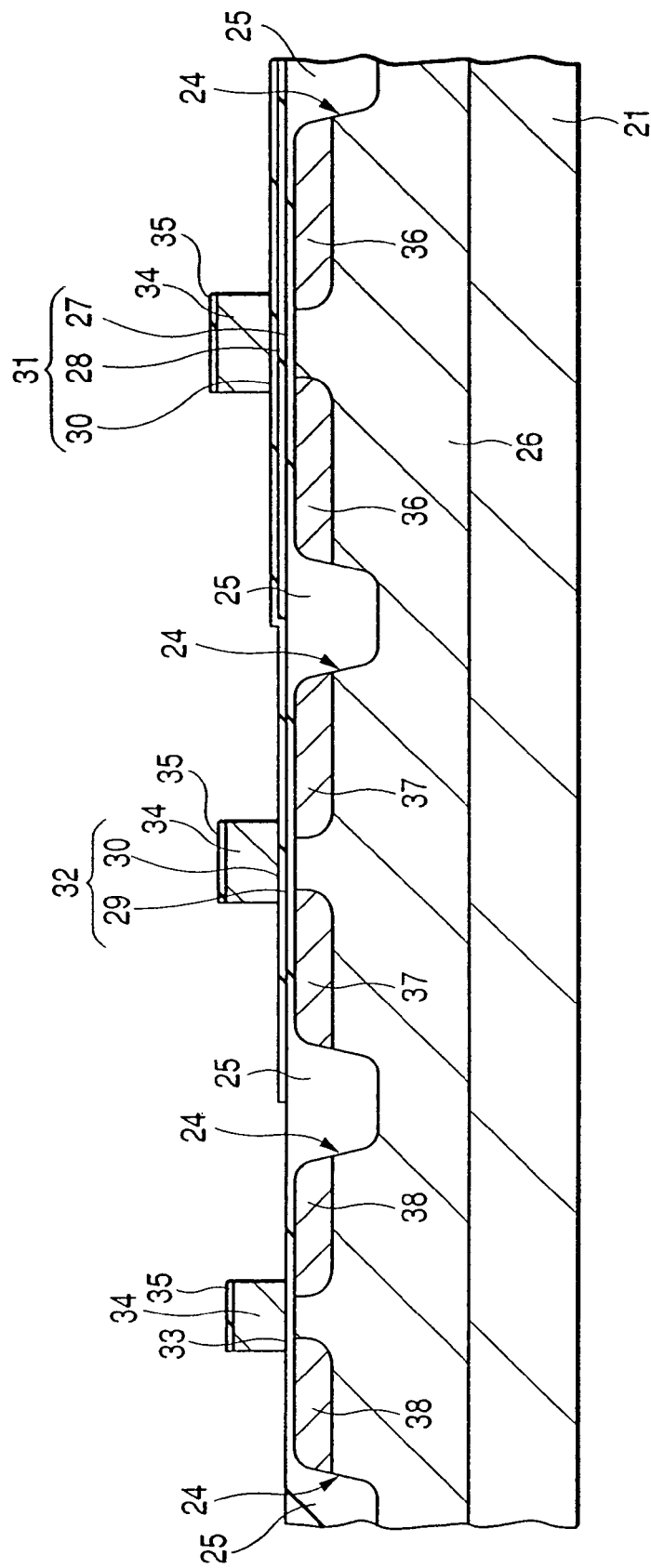
FIG. 21 is a section for illustrating the method for manufacturing the semiconductor integrated circuit device.

Next, the paired n-type semiconductor regions 36 are selectively formed in the first element forming region by an ion implantation method. After this, the paired n-type semiconductor regions 37 are selectively formed in the second element forming region by an ion implantation method. After this, the paired n-type semiconductor regions 38 are selectively formed in the third element forming region by an ion implantation method. The manufacturing steps up to this point are shown in FIG. 21.

Figure 22:
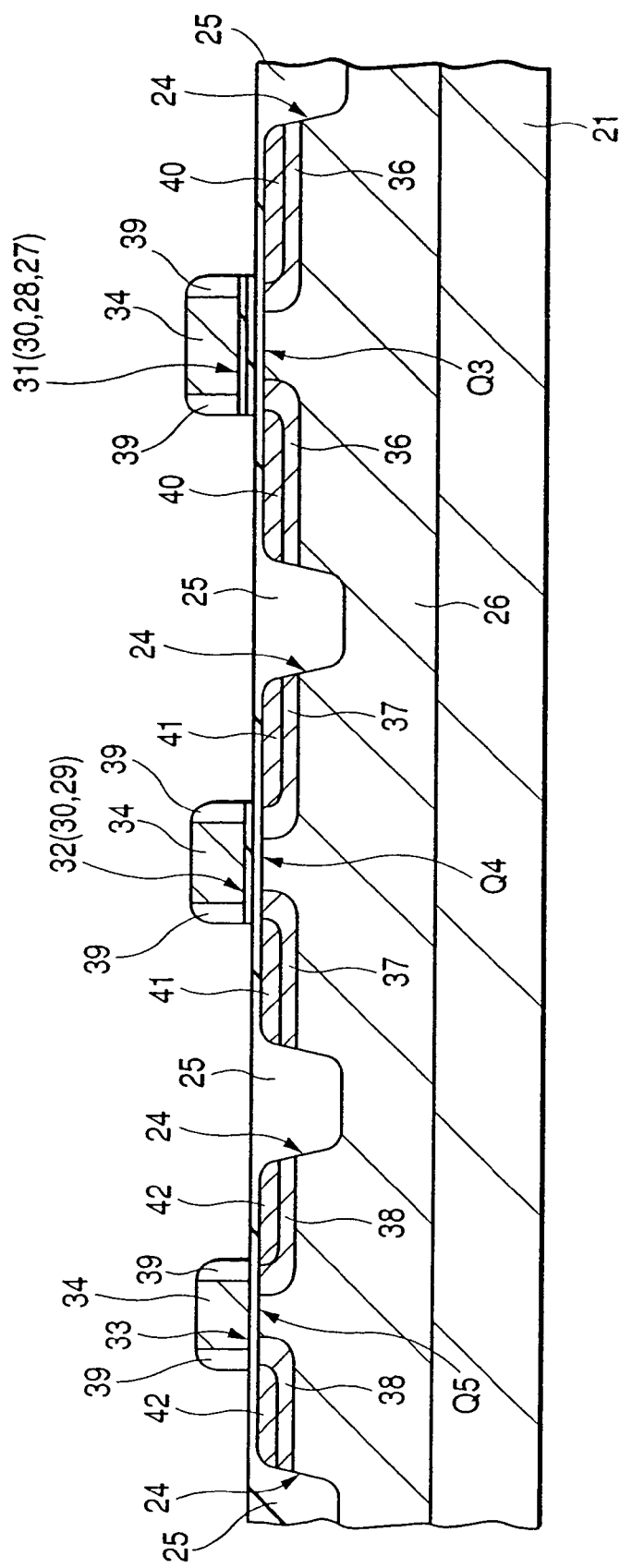
FIG. 22 is a section for illustrating the method for manufacturing the semiconductor integrated circuit device.

Next, side wall spacers 39 for covering the side faces of the gate electrodes 34, and the paired n-type semiconductor regions 40 are selectively formed in the first element forming region by an ion implantation method. After this, the paired n-type semiconductor regions 41 are selectively formed in the second element forming region by an ion implantation method. After this, the paired n-type semiconductor regions 42 are selectively formed in the third element forming region by an ion implantation method. At this step, the field effect transistors Q3, Q4 and Q5 are substantially completed. The manufacturing steps up to this point are shown in FIG. 22.

Next, an interlayer insulating film 43 is formed all over the p-type semiconductor substrate 21. After this, the connection holes are formed in the interlayer insulating film 43. After this, first layer wiring 44 is formed over the interlayer insulating film 43, thus establishing the state shown in FIG. 15.

In this embodiment, the step formed at the end portions of the element isolating regions between the third element forming region and the buried insulating film 25 is 15 [nm]. When the gate insulating films of the field effect transistors Q3 and Q4 are formed of ordinary thermally oxidized films, the step at the element isolating regions between the third element forming region and the buried insulating film 25 is 40 [nm]. Thus, the step can be reduced to about one third. As a result, the reduction of the threshold voltage of 0.3 [V] due to the kink, achieved in the sub-thresh characteristics of the field effect transistor Q5, can be suppressed to realize normal operation of the field effect transistor Q5.

[Embodiment 3]

This embodiment will be described taking the case in which the invention is applied to a microcomputer (a semiconductor integrated circuit device) having a built-in flash memory.

Figure 23:
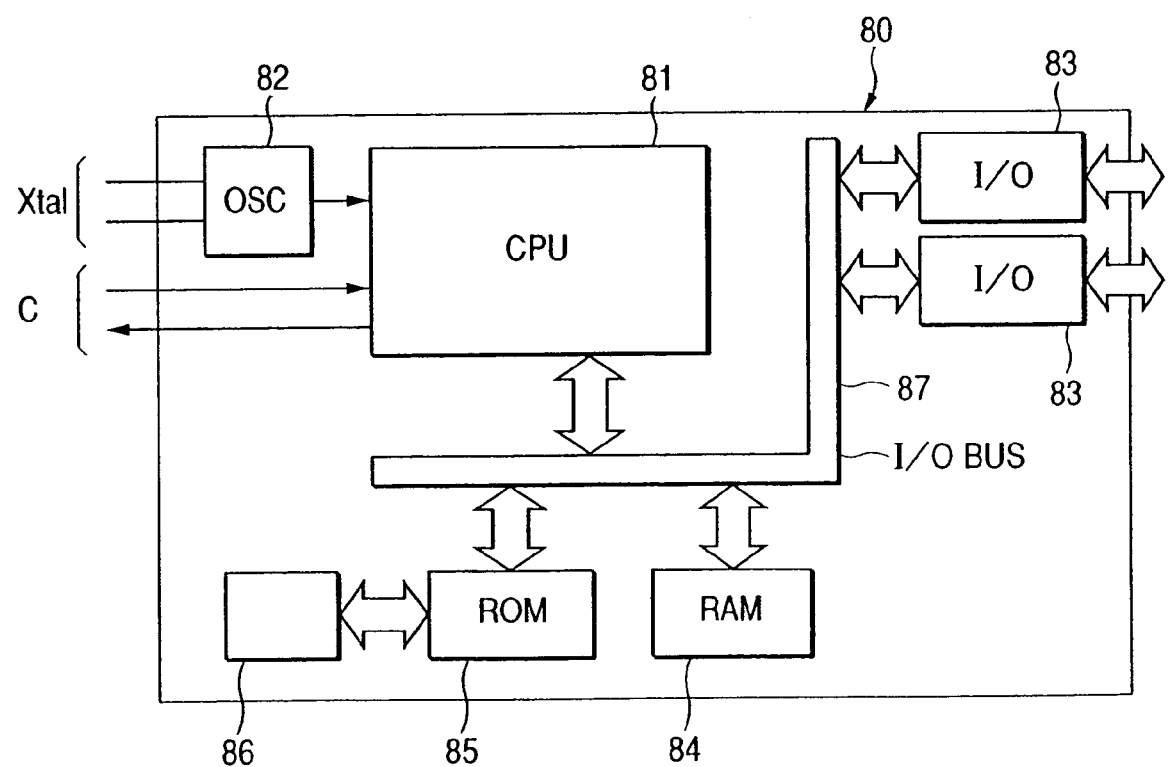
FIG. 23 is a schematic block diagram showing a microcomputer (a semiconductor integrated circuit device) representing an Embodiment 3 according to the invention.

FIG. 23 is a block diagram showing a schematic construction of a microcomputer of Embodiment 3 according to the invention.

As shown in FIG. 23, a microcomputer 80 has a central processing unit, a control unit, an arithmetic operation unit, a memory unit, and an input/output unit and so on mounted on the same substrate. The central processing unit, the control unit and the arithmetic operation unit are constructed into a processor unit (CPU) 81. The input/output unit is constructed of a data input/output circuit unit (I/O) 83. The memory unit is constructed of a RAM unit 84 and a ROM unit 85 on the RAM unit 84, there are mounted a DRAM (Dynamic Random Access Memory) and a SRAM (Static Random Access Memory). On the ROM unit 85, there is mounted a flash memory. These individual units are connected to one another through an input/output data bus (I/O BUS) 87. Moreover, the microcomputer 80 has a power supply unit 86 and a clock oscillator 82 mounted therein.

The processor unit 81 has field effect transistors operating at 1.8 [V]; the data input/output circuit unit 83 has field effect transistors operating at 1.8 [V] and field effect transistors operating at 3.3 [V]; and the power unit has field effect transistors operating at 15 [V].

Figure 24:
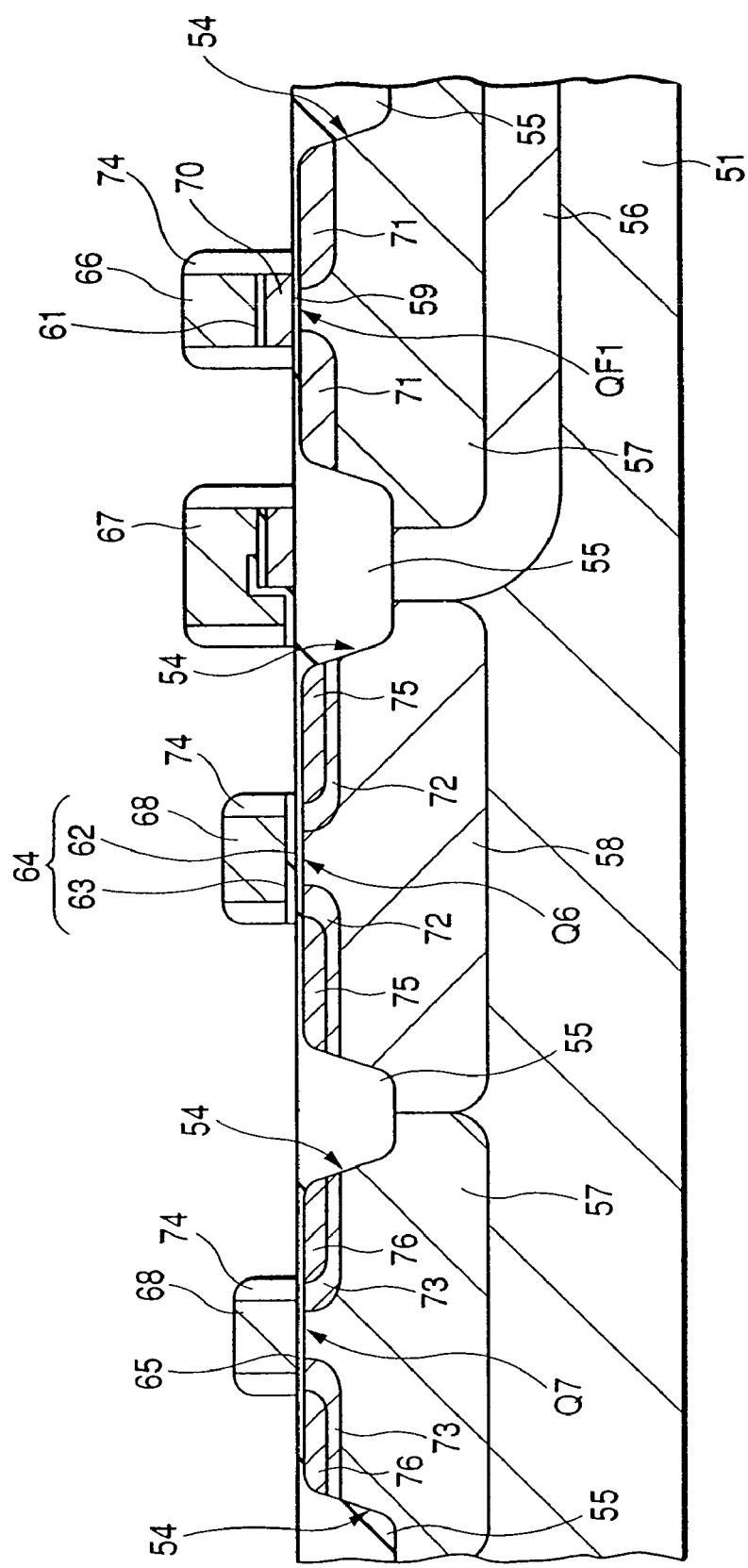
FIG. 24 is a section showing a schematic construction of three field effect transistors mounted in the microcomputer.

Next, a specific structure of the microcomputer will be described with reference to FIG. 24 (a section). FIG. 24 shows a nonvolatile memory element (memory cell), a field effect transistor operating at 15 [V] and a field effect transistor operating at 1.8 [V].

As shown in FIG. 24, the microcomputer 80 is constructed mainly of a p-type semiconductor substrate 51 made of single crystalline silicon, for example.

On the main surface of the p-type semiconductor substrate 51, there are formed a plurality of element forming regions. These element forming regions are defined by grooves 54, which are formed in the element isolating regions of the main surface of the p-type semiconductor substrate 51, and a buried insulating film 55 buried in the grooves, so that they are insulated and isolated (electrically isolated) from one another.

Of the element forming regions, the first element forming region has a deep n-type well region 56 and a p-type well region 57; the second element forming region has an n-type well region 58; and the third element forming region has the p-type well region 57.

In the first element forming region, there is a nonvolatile memory element QF1 for performing a write operation and an erase operation by the tunnel effect. This nonvolatile memory element QF1 is constructed mainly of the p-type well region 57 to serve as the channel forming region, a gate insulating film (tunnel insulating film) 59, a floating gate electrode (floating gate electrode) 70, an interlayer insulating film 61, a control gate electrode (control gate electrode) 66, and a pair of n-type. Semiconductor regions 71 which are the source region and the drain region.

The data are written in the nonvolatile memory element QF1, for example, by applying a predetermined voltage between the control gate electrode 66 and the drain region (one of the n-type semiconductor regions 71) to cause electrons stored in the floating gate electrode 70 to tunnel the gate insulating film 59 from the floating gate electrode 70 to the drain region. The data are erased from the nonvolatile memory element QF1, for example, by applying a predetermined voltage to the control gate electrode 66 to invert the channel forming region into the n-type thereby to cause electrons in the inverted channel forming region to tunnel the gate insulating film 59 to the floating gate electrode 70.

In the second element forming region, there is a field effect transistor Q6 of p-channel conductivity type operating at 15 [V]. This field effect transistor Q6 is constructed as a p-channel type MISFET, for example, and is so constructed as to include an n-type well region 58 to serve as the channel forming region, a gate insulating film 64, a gate electrode 68, and a pair of p-type semiconductor regions 72 and a pair of p-type semiconductor regions 75 which are the source region and the drain region. The impurity concentration of the p-type semiconductor region 75 is a higher than that of the p-type semiconductor region 72. The thickness of the gate insulating film 31 of the field effect transistor Q6 is about 20 [nm]. The gate insulating film 64 comprises a thermally oxidized film 62 and a deposited film 63.

In the third element forming region, there is a field effect transistor Q7 of n-channel conductivity type operating at 1.8 [V]. This field effect transistor Q7 is constructed as an n-channel type MISFET, for example, and is so constructed as to include a p-type well region 57 to serve as the channel forming region, a gate insulating film 65, a gate electrode 68, and a plurality of n-type semiconductor regions 73 and a plurality of n-type semiconductor regions 76 which are the source region and the drain region. The impurity concentration of the n-type semiconductor region 76 is higher than that of the n-type semiconductor region 73. The thickness of the gate insulating film 65 of the field effect transistor Q7 is about 12 [nm]. The gate insulating film 65 is a thermally oxidized film.

Thus, the gate insulating film 64 of the field effect transistor Q6 is made thicker than the gate insulating film 65 of the field effect transistor Q7. Moreover, the intensity of electric field applied to the gate insulating film 64 of the field effect transistor Q6 is greater than that applied to the gate insulating film of the field effect transistor Q7.

Next, a method for manufacturing the microcomputer will be described with reference to FIGS. 25 to 32 (sections for illustrating the manufacturing method).

First, there is prepared the p-type semiconductor substrate 51 which is made of single crystalline silicon, for example.

Next, by using the method used in Embodiment 1, the first element forming region, the second element forming region and the third element forming region of the main surface of the p-type semiconductor substrate 51 are insulated and isolated (electrically isolated) from one another by forming the grooves 54 in the element isolating regions of the main surface of the p-type semiconductor substrate 51 and subsequently by forming the buried insulating film 55 in the grooves 54.

Next, thermal oxidation is executed to form an impurity-introducing buffer insulating film 52 of a silicon oxide film having a thickness of about 10 [nm] over the first element forming region, the second element forming region and the third element forming region of the main surface of the p-type semiconductor substrate 51.

Next, the deep n-type well region 56 is formed by doping the first element forming region selectively with an impurity of phosphor by an ion implantation method. The phosphor is introduced under the conditions in which the final dosage is about $1\times10^{13}$ [atoms/cm$^2$] and in which the energy for the introduction is 3,000 [KeV]. Next, the p-type well region 57 is formed by doping the first element forming region and the third element forming region selectively with an impurity of boron by an ion implantation method. The boron introduction is performed separately in three times. The first introduction is performed under the conditions of the final dosage of about $1\times10^{13}$ [atoms cm$^2$] and the introduction energy of 350 [KeV]. The second introduction is performed under the conditions of the final dosage of about $3\times10^{12}$ [atoms/cm$^2$] and the introduction energy of 130 [KeV]. The third introduction is performed under the conditions of the final dosage of about $1.2\times10^{12}$ [atoms/cm$^2$] and the introduction energy of 50 [KeV].

Figure 25:
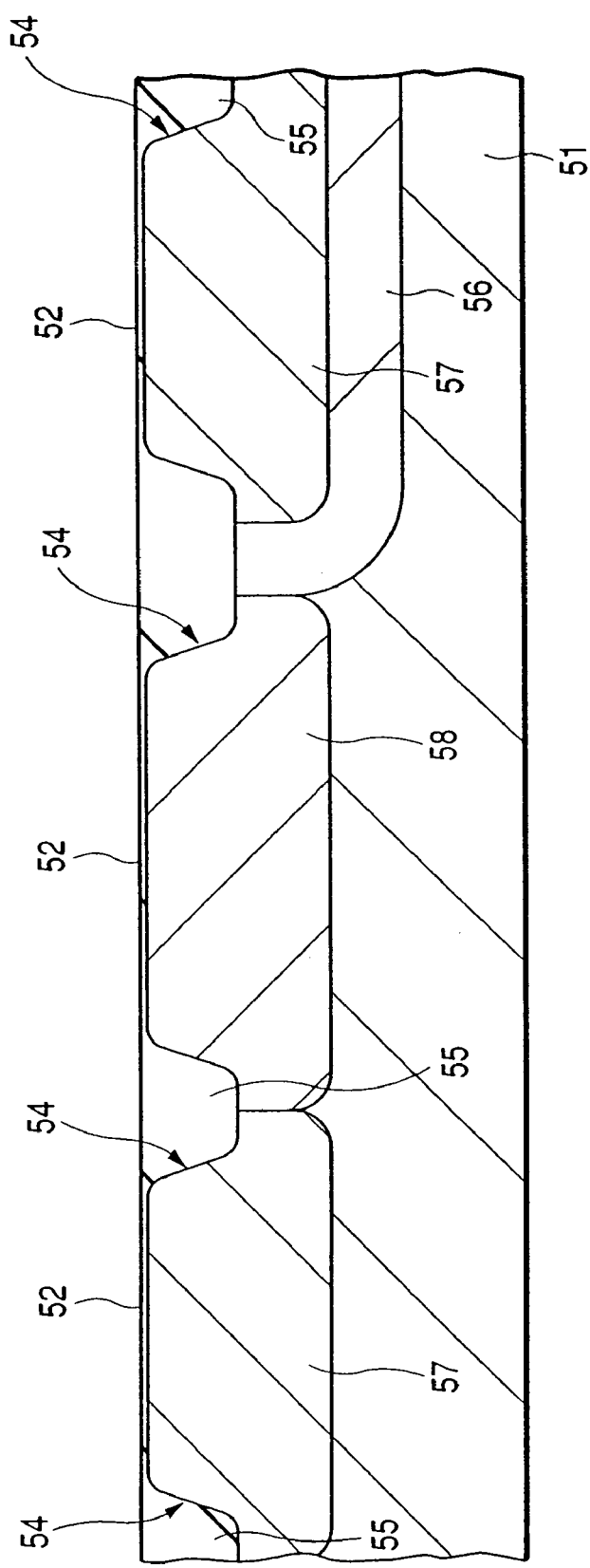
FIG. 25 is a section for illustrating a method for manufacturing the microcomputer.

Next, the n-type well region 58 is formed by doping the second element forming region selectively with impurities of phosphor and boron by an ion implantation method. The phosphor introduction is performed separately three times, and the boron introduction is then performed. The first phosphor introduction is performed under the conditions of the final dosage of about $1.5\times10^{12}$ [atoms/cm$^2$] and the introduction energy of 700 [KeV]. The second phosphor introduction is performed under the conditions of the final dosage of about $3\times10^{13}$ [atoms/cm$^2$] and the introduction energy of 370 [KeV]. The third phosphor introduction is performed under the conditions of the final dosage of about $1\times10^{12}$ [atoms/cm$^2$] and the introduction energy of 180 [KeV]. The boron introduction is performed under the conditions of the final dosage of about $1.5\times10^{12}$ [atoms/cm$^2$] and the introduction energy of 200 [KeV]. The manufacturing steps up to this point are shown in FIG. 25.

Next, the buffer insulating film 52 is removed by a wet-etching method using an aqueous solution of hydrofluoric acid to expose the surfaces of the first element forming region, the second element forming region and the third element forming region of the main surface of the p-type semiconductor substrate 51 to the outside.

Next, thermal oxidation is executed by a dry oxidation method to form the gate insulating film 59 of a thermally oxidized film having a thickness of about 10 [nm] over the first element forming region of the main surface of the p-type semiconductor substrate 51. At this step, the thermally oxidized film is also formed over the second element forming region and the third element forming region.

Next, a floating gate member 60 of a polycrystalline silicon film having a thickness of about 50 [nm] and an impurity concentration of about $4\times10^{20}$ [atoms/cm$^2$] is formed by a chemical vapor deposition all over the p-type semiconductor substrate 51 including the element forming regions.

Figure 26:
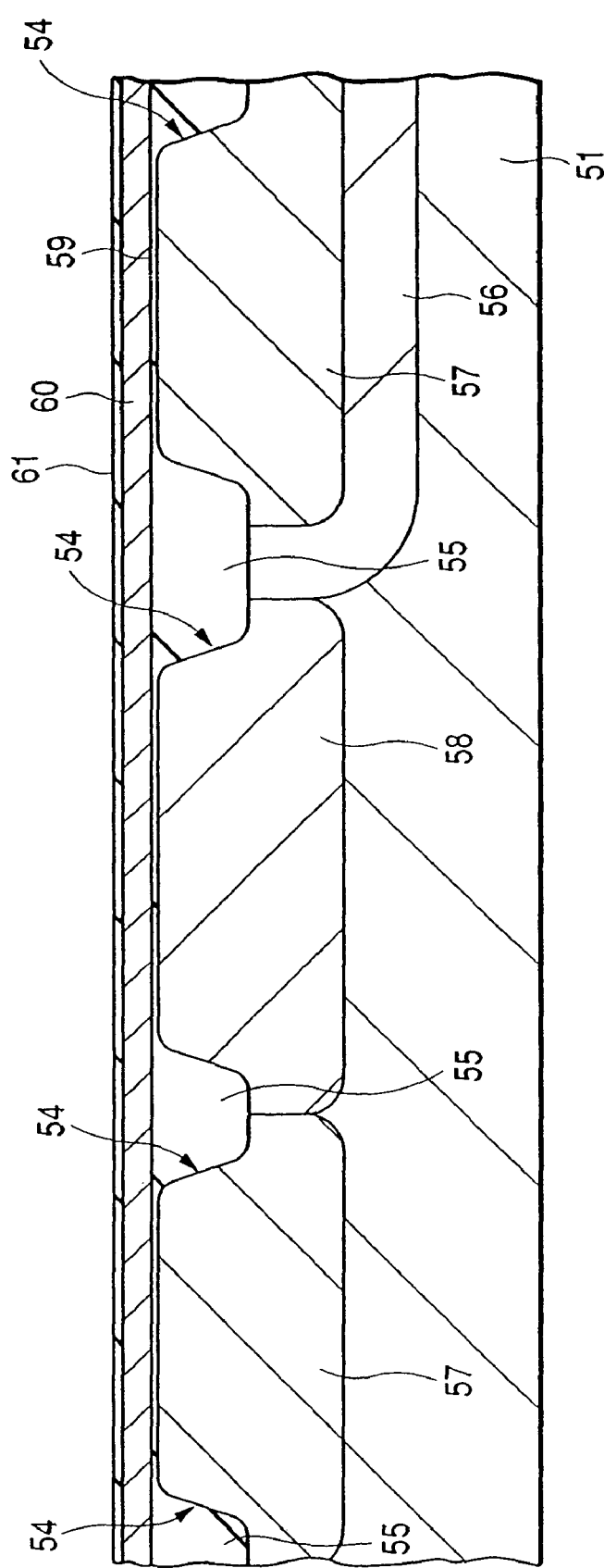
FIG. 26 is a section for illustrating the method for manufacturing the microcomputer.

Next, chemical vapor deposition is performed to form an oxide film having a thickness of about 4 [nm], a nitride film having a thickness of about 7 [nm], an oxide film having a thickness of about 4 [nm] and a nitride film having a thickness of about 11 [nm] sequentially all over the floating gate member 60, thereby to form the interlayer insulating film 61. The manufacturing steps up to this point are shown in FIG. 26.

Next, there is formed a mask M50 covering the first element forming region while leaving the second and third element forming regions open. This mask M50 is prepared by the photolithographic technique using a photoresist film.

Figure 27:
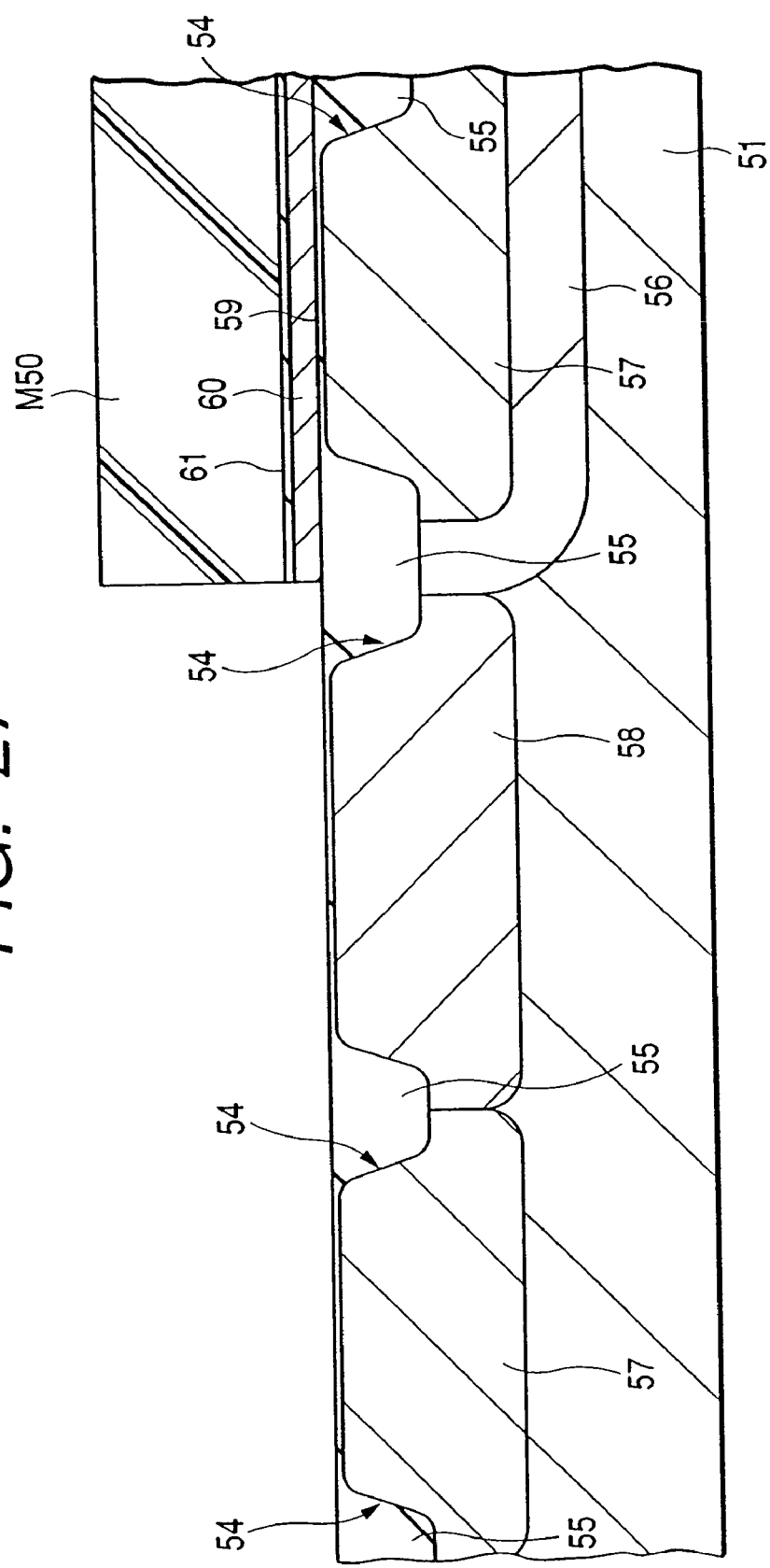
FIG. 27 is a section for illustrating the method for manufacturing the microcomputer.

Next, the interlayer insulating film 61 and the floating gate member 60 are individually patterned sequentially by using the mask M50 as the etching mask. The manufacturing steps up to this are shown in FIG. 27.

Next, the mask M50 is ashed off, and the thermally oxidized film (the gate insulating film 59) is removed by a wet-etching method from over the second element forming region and the third element forming region.

Figure 28:
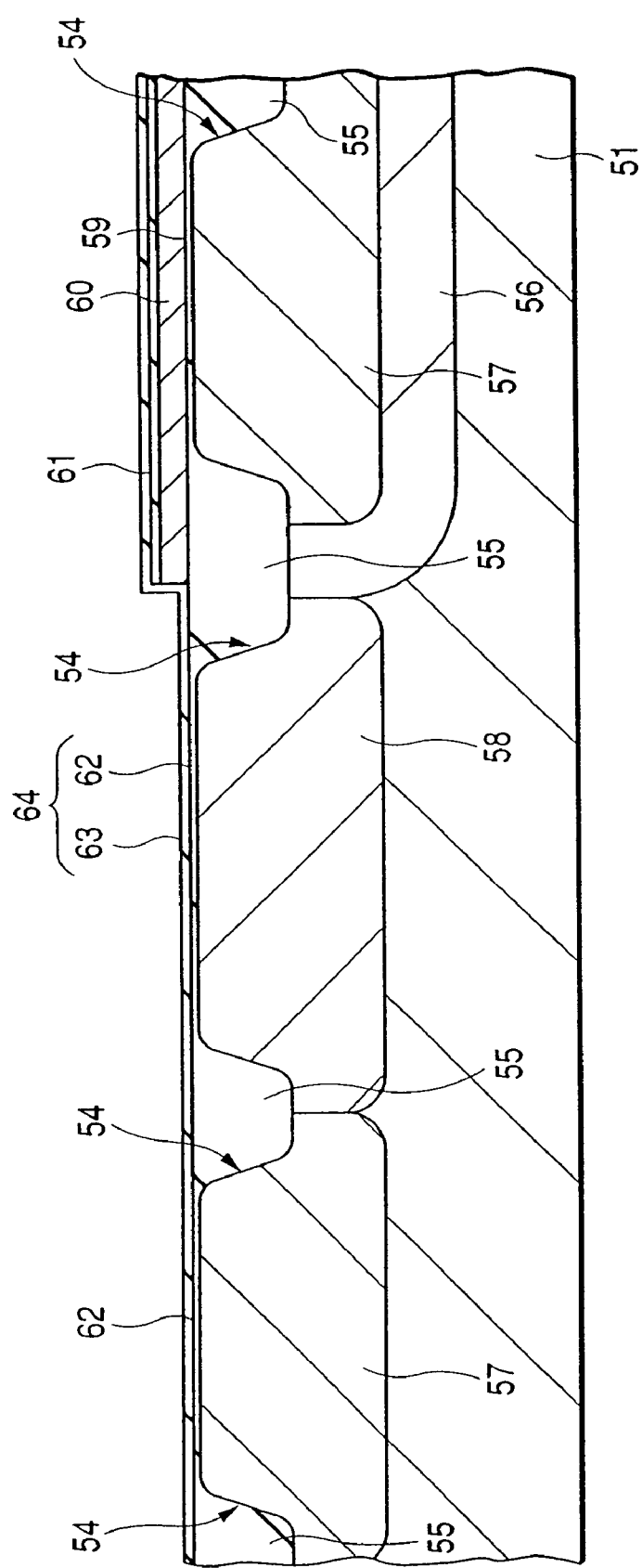
FIG. 28 is section for illustrating the method for manufacturing the microcomputer.

Next, thermal oxidation is executed by a dry-oxidizing method to form the thermally oxidized film 62 having a thickness of about 3 [nm] over the second and third element forming regions. After this, a chemical vapor deposition method is used to form the deposited film 63 of a silicon oxide film having a thickness of 17 [nm], all over the p-type semiconductor substrate 51 including the thermally oxidized film 62 and the buried insulating film 55. At this step, the gate insulating film 64 comprising the thermally oxidized film 62 and the deposited film 63 is formed over the second element forming region. The manufacturing steps up to this point are shown in FIG. 28.

Next, there is formed a mask M51 covering the second element forming region while leaving the first and third element forming regions open. This mask M51 is prepared by the photolithographic technique. The mask M51 is so formed that its end portions are positioned over the buried insulating film 55.

Figure 29:
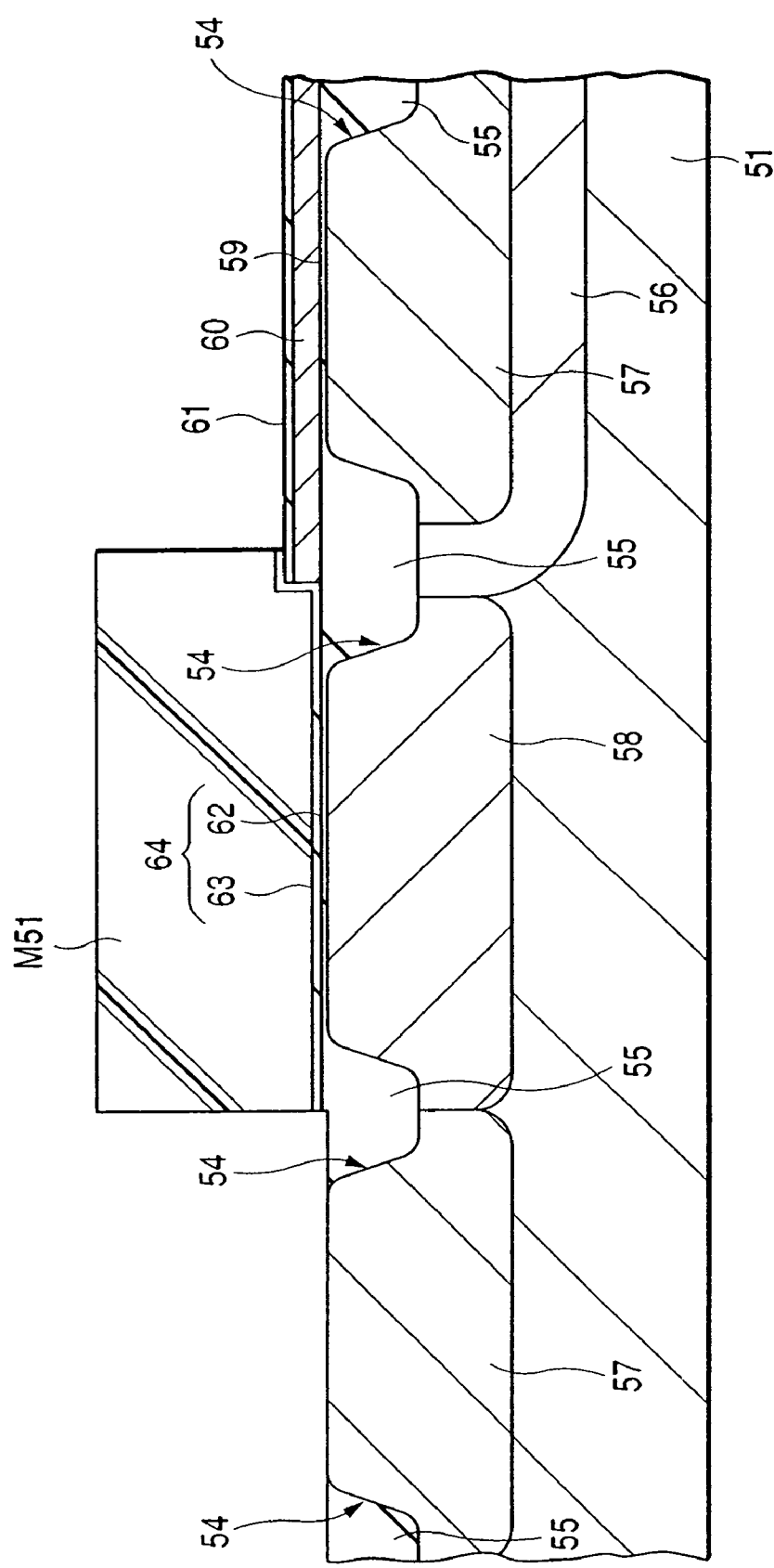
FIG. 29 is a section for illustrating the method for manufacturing the microcomputer.

Next, the mask M51 is employed as the etching mask to remove the deposited film 63 from over the third element forming region and the deposited film 63 from over the thermally oxidized film 62 and the interlayer insulating film 61 by a wet-etching method. At this step, the buried insulating film 55 is not etched off until the deposited film 63 is removed, because it is covered with the deposited film 63. The manufacturing steps up to this point are shown in FIG. 29.

Next, the mask M51 is ashed off, and thermal oxidation is then executed by a dry oxidation method to form the gate insulating film 65 of a thermally oxidized film having a thickness of about 5 [nm] over the third element forming region. At this step, an extremely thin thermally oxidized film is formed between the second element forming region of the main surface of the p-type semiconductor substrate 51 and the thermally oxidized film 62. Moreover, the deposited film 63 is densified to improve its film quality. By this step, there are formed the gate insulating film 64 and the gate insulating film 65 having different thicknesses.

Next, a polycrystalline silicon film having a thickness of about 200 [nm] and an impurity concentration of about $4\times10^{20}$ [atoms/cm$^3$] is formed by a chemical vapor deposition method all over the p-type semiconductor substrate 51 including the gate insulating film 64 and the gate insulating film 65. After this, a silicon oxide film 69 having a thickness of about 50 [nm] is formed by a chemical vapor deposition method all over the polycrystalline silicon film.

Figure 30:
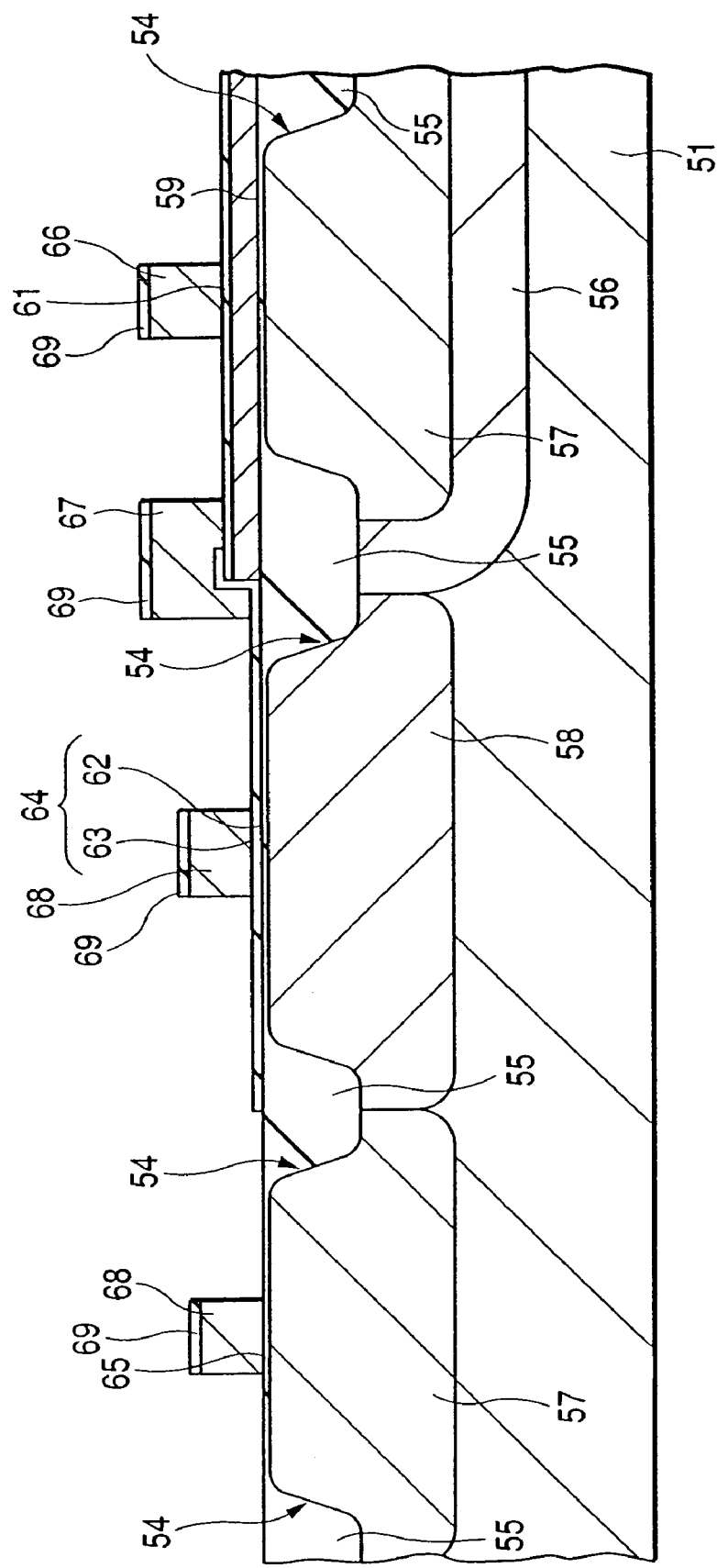
FIG. 30 is a section for illustrating the method for manufacturing the microcomputer.
Figure 31:
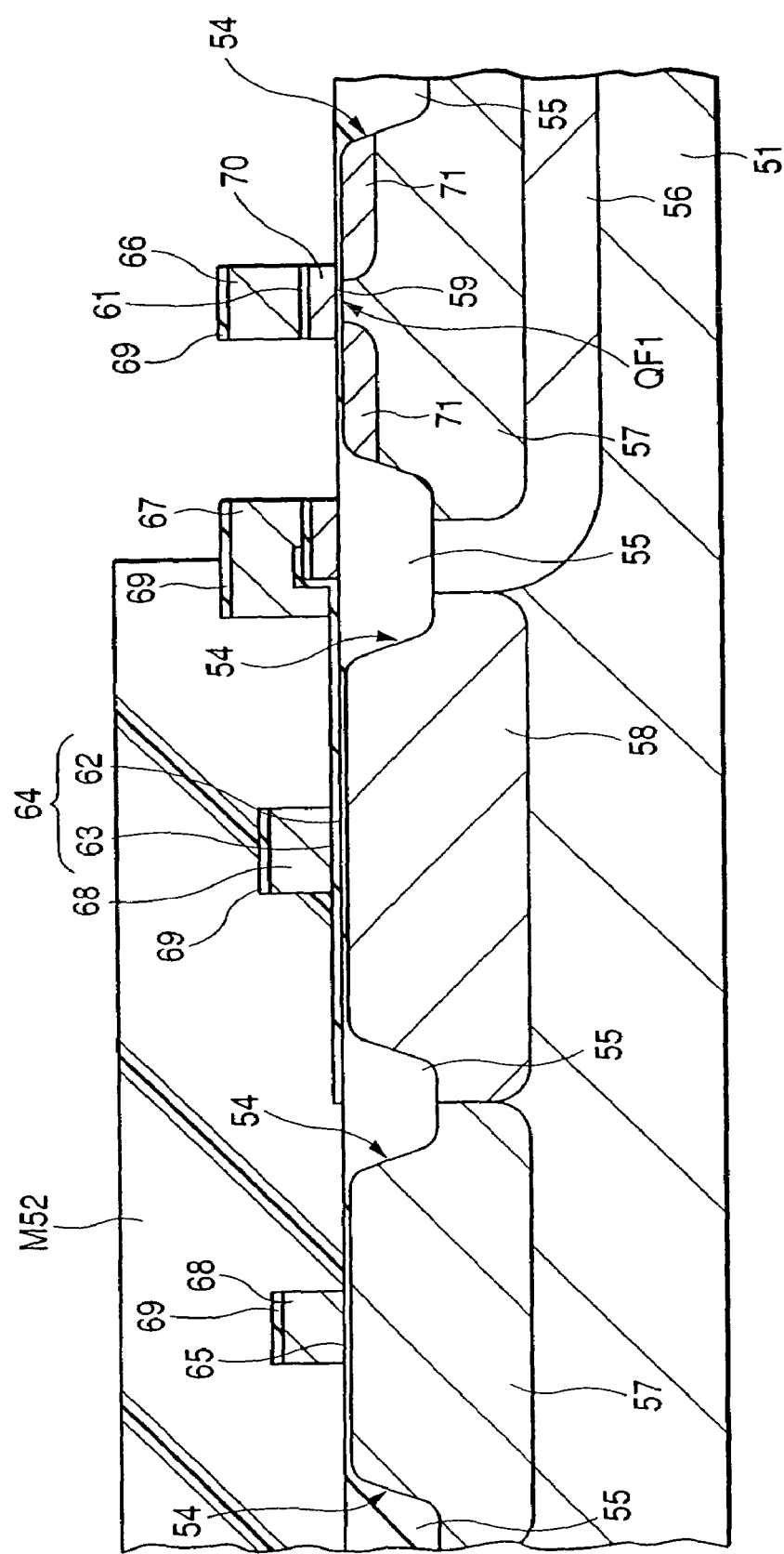
FIG. 31 is a section for illustrating the method for manufacturing the microcomputer.

Next, the silicon oxide film 69 and the polycrystalline silicon film are individually patterned to form the control gate electrodes 66 over the interlayer insulating film 61 and a dummy wiring 67 over the element isolating regions and to form the gate electrodes 68 over the gate insulating film 64 and the gate insulating film 65. The manufacturing steps up to this point are shown in FIG. 30.

Next, there is formed a mask M52 covering the second and third element forming regions while leaving the first element forming region open. This mask M52 is formed by the photolithographic technique using a photoresist film.

Next, the mask M52 is used as the etching mask to dry-etch the interlayer insulating film 61 and the floating gate member 70 sequentially to form the floating gate electrodes 70. After this, the mask M51 is used as the impurity introducing mask to dope the first element forming region selectively with an impurity of arsenic by an ion implantation method to form the paired n-type semiconductor regions 71 which are the source region and the drain region. The arsenic introduction is performed under the conditions of the final dosage of about $1\times10^{15}$ [atoms/cm$^2$] and the introduction energy of 50 [KeV]. By this step, the nonvolatile memory element QF1 is substantially completed.

Figure 32:
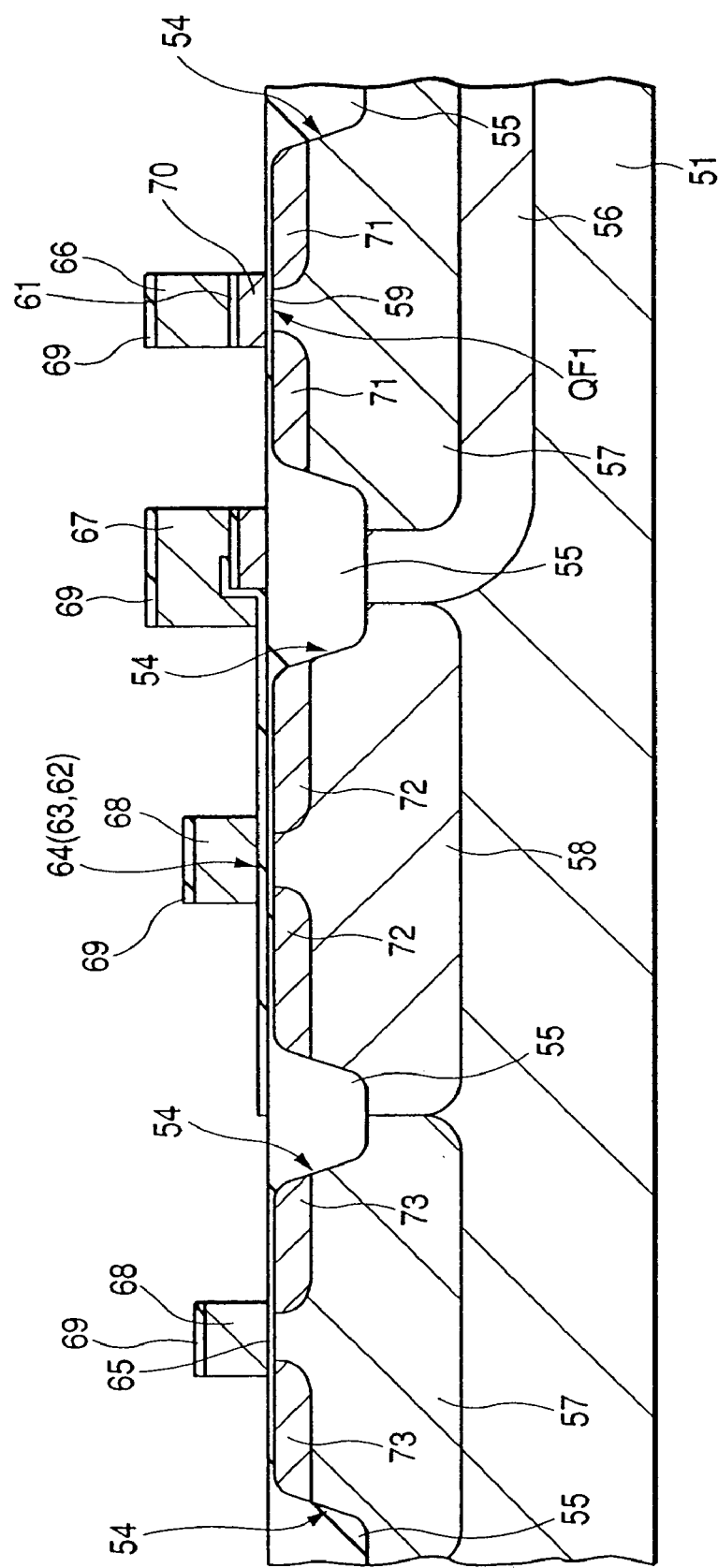
FIG. 32 is a section for illustrating the method for manufacturing the microcomputer.

Next, the second element forming region is selectively doped with an impurity of boron by an ion implantation method to form the paired p-type semiconductor regions 72 which are the source region and the drain region. After this, the third element forming region is selectively doped with an impurity of phosphor by an ion implantation method to form the paired n-type semiconductor regions 73 which are the source region and the drain region. The manufacturing steps up to this point are shown in FIG. 32.

Next, there are formed side wall spacers 74 covering the side faces of the gate electrodes 68 and covering the electrode side faces of the nonvolatile memory element QF1. These side wall spacers 74 are provided by forming an insulating film of a silicon nitride film all over the p-type semiconductor substrate 51 and subsequently by subjecting the insulating film to anisotropic etching treatment.

Next, the second element forming region is selectively doped with an impurity of boron by an ion implantation method to form the paired p-type semiconductor regions 75 which are the source region and the drain region. After this, the third element forming region is selectively doped with an impurity of phosphor by an ion implantation method to form the paired n-type semiconductor regions 76 which are the source region and the drain region. Thus, there is established the state shown in FIG. 24.

After this, the microcomputer is completed by forming the interlayer insulating film, the connection holes and the metal-wiring.

In this embodiment, the height of the step at the end portions of the element isolating regions between the third element forming region and the buried insulating film 55 is 5 [nm]. Neither the gate breakdown voltage nor the sub-thresh-characteristics of the field effect transistor Q7 are deteriorated, and they are equivalent to those of the case in which field effect transistors for high voltage are not formed. This allows the effectiveness of the invention to be ensured.

In this embodiment, at the manufacturing step shown in FIG. 30, thermal oxidation is executed to form the gate insulating film 65 of a thermally oxidized film having a thickness of 5 [nm] over the third element forming region. By additionally performing a nitrization at 900° C. in nitrogen monoxide (NO) just after the step, however, the reliability of the gate insulating film 65 can be further improved.

[Embodiment 4]

This embodiment will be described taking the case in which the invention is applied to a semiconductor integrated circuit device including two kinds of field effects transistors having gate insulating films of different lengths and a nonvolatile memory element, with reference to FIGS. 33 to 38 (sections for illustrating the manufacturing method).

Figure 33:
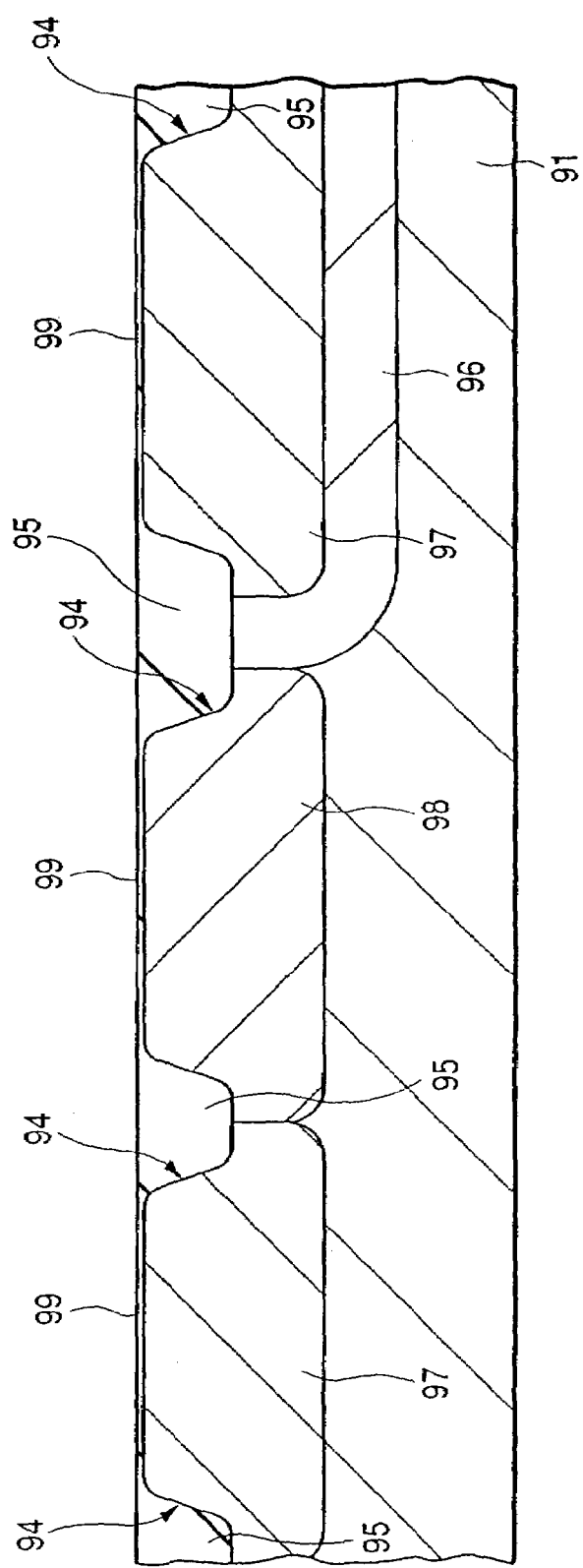
FIG. 33 is a section for illustrating a method for manufacturing a semiconductor integrated circuit device representing an Embodiment 4 according to the invention.

FIG. 33 shows the state, in which the element forming regions are insulated and isolated by forming grooves 94 in the element isolating regions of the main surface of a p-type semiconductor substrate 91 and by forming a buried insulating film 95 in the grooves 94, a deep n-type well region 96 is then formed in the first element forming region of the main surface of the p-type semiconductor substrate 91, a p-type well region 97 is then formed in the first and third element forming regions of the p-type semiconductor substrate 91, an n-type well region 98 is then formed in the second element forming region of the main surface of the p-type semiconductor substrate 91, and thermal oxidation is executed to form a gate insulating film (a tunnel insulating film) 99 of the nonvolatile memory element over the first element forming region.

Figure 34:
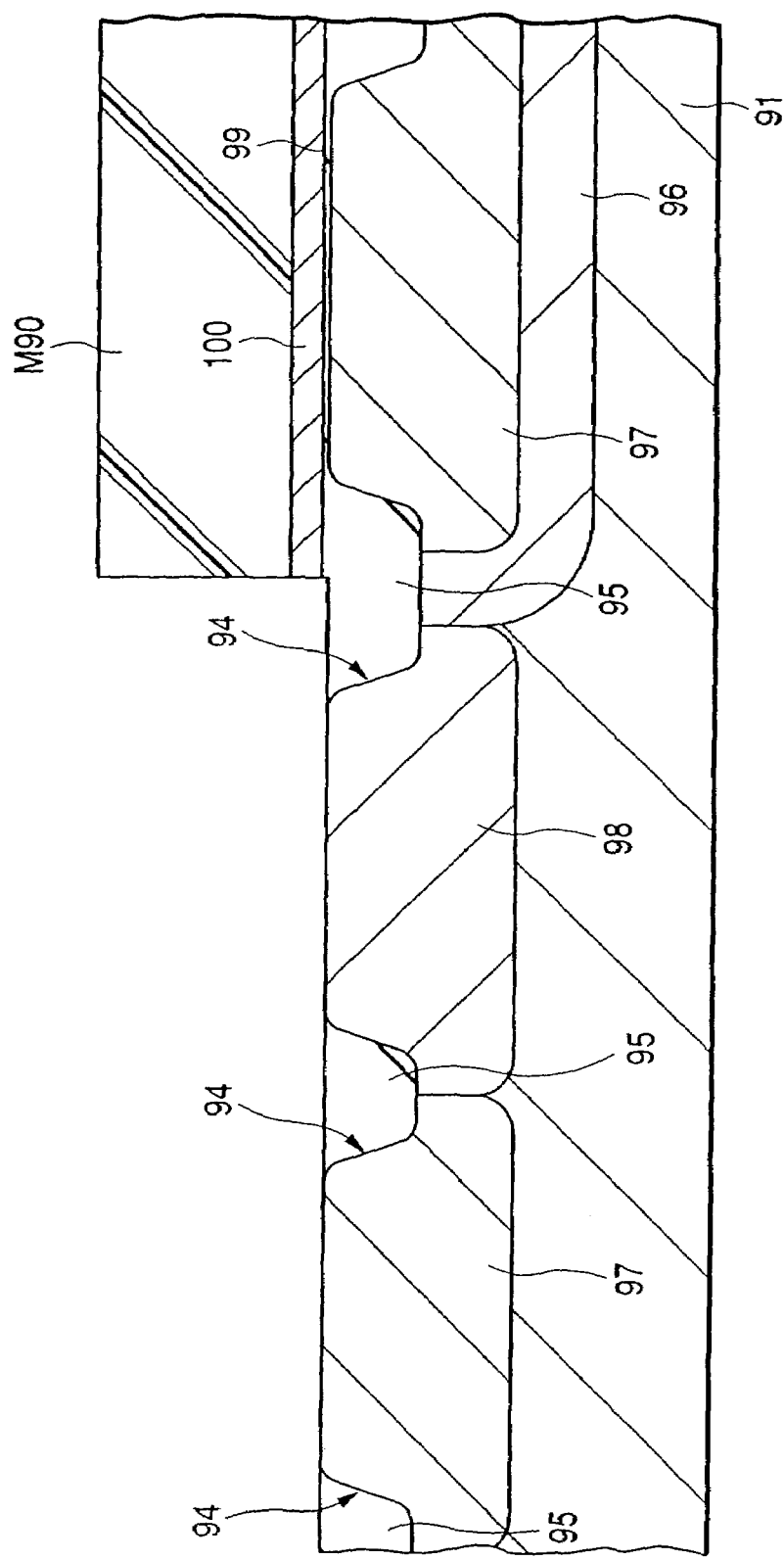
FIG. 34 is a section for illustrating a method for manufacturing the semiconductor integrated circuit device.

Next, a floating gate member 100 of a polycrystalline silicon film having a thickness of bout 50 [nm] and an impurity concentration of about $4\times10^{20}$ [atoms/cm$^4$] is formed by a chemical vapor deposition method all over the p-type semiconductor substrate 91 including the element forming regions. After this, there is formed a mask M90 covering the first element forming region while leaving the second and third element forming regions open. After this, the mask M90 is used to etch the floating gate member 100. After this the gate insulating film 99 is removed by a wet-etching method from over the second and third element forming regions. The manufacturing steps up to this point are shown in FIG. 34.

Next, the mask M90 is ashed off, and thermal oxidation is executed to form a thermally oxidized film 101 having a thickness of 4 [nm] over the second and third element forming regions. After this, a deposited film (an interlayer insulating film) 102 of a silicon oxide film having a thickness of 16 [nm] is formed by a chemical vapor deposition method all over the p-type semiconductor substrate 91 including the thermally oxidized film 101. At this step, a gate insulating film 103, formed of the thermally oxidized film 101 and the deposited film 102, is formed over the second element forming region, and an interlayer insulating film of the deposited film 102 is formed over the floating gate member 100.

Figure 35:
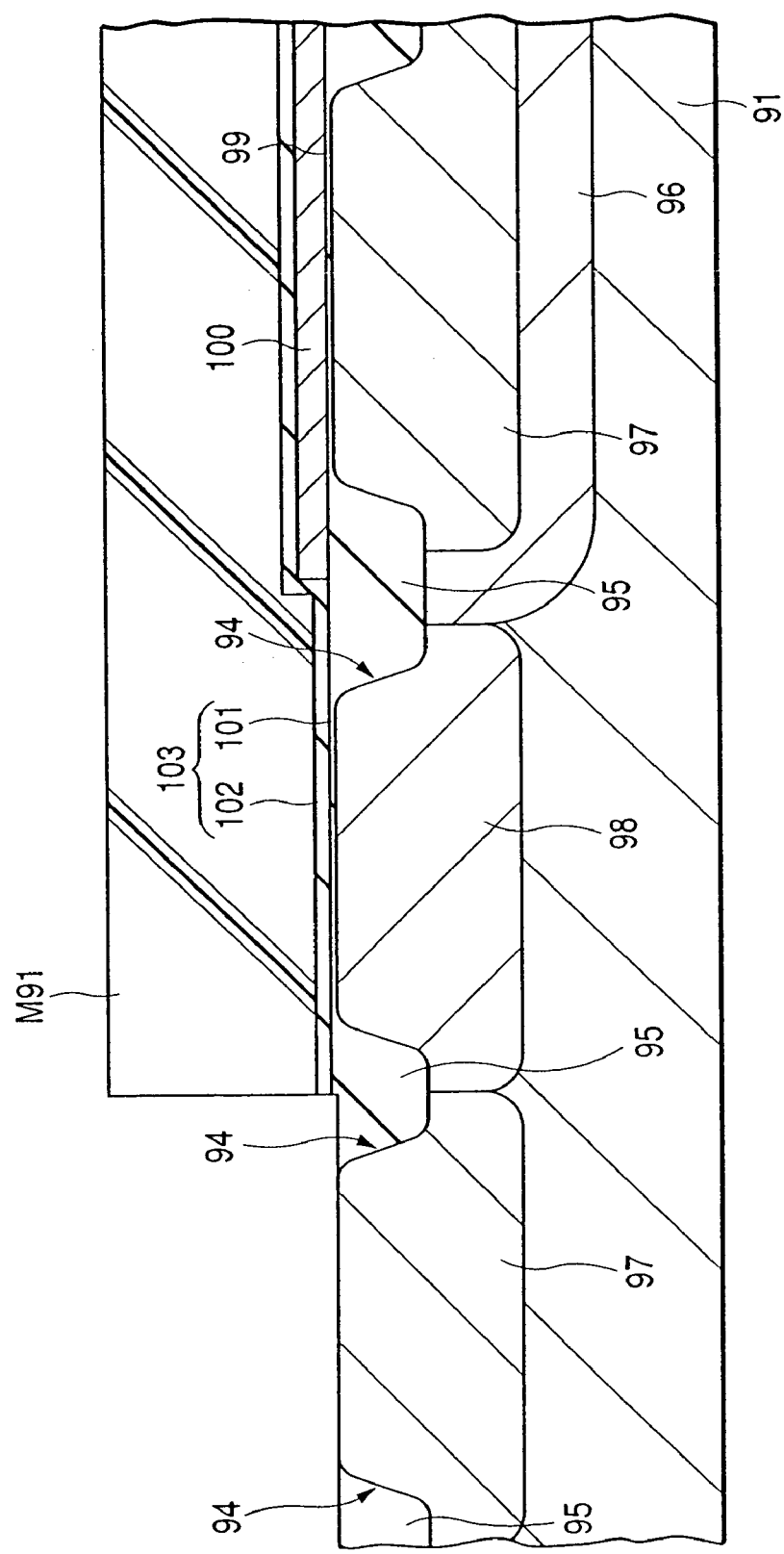
FIG. 35 is a section for illustrating the method for manufacturing the semiconductor integrated circuit device.

Next, there is formed a mask M91 of a photoresist film, which covers the first and second element forming regions while leaving the third element forming region open. After this, the deposited film 102 and the thermally oxidized film 101 are removed by a wet-etching method from over the third element forming region. At this step, the buried insulating film 95 is not etched until the deposited film 102 is removed, because it is covered with the deposited film 102. The mask M91 is so formed that its end portions are positioned over the buried insulating film 95. The manufacturing steps up to this point are shown in FIG. 35.

Figure 36:
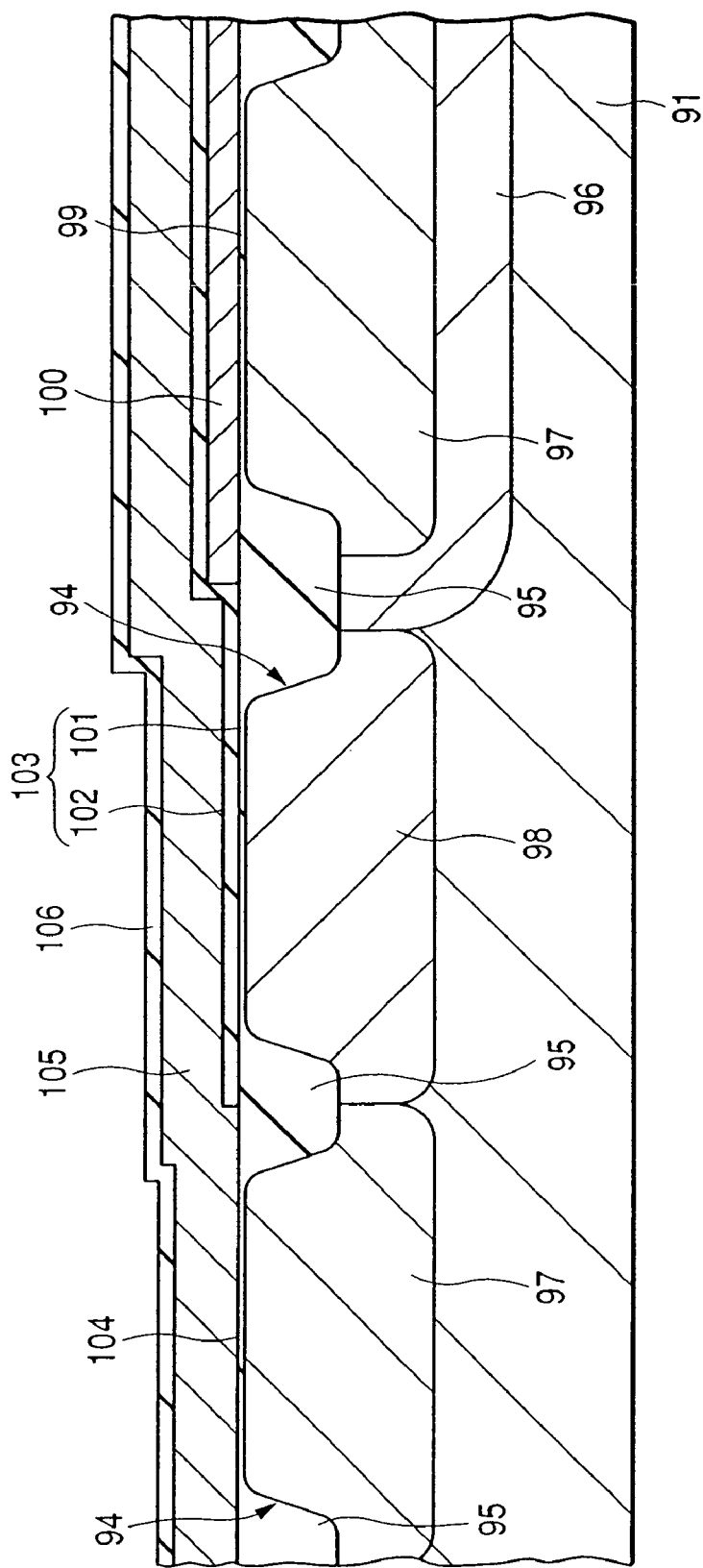
FIG. 36 is a section for illustrating the method for manufacturing the semiconductor integrated circuit device.

Next, the mask M91 is ashed off, and thermal oxidation is then executed to form a gate insulating film 104 of a thermally oxidized film having a thickness of 5 [nm] over the third element forming region. After this, a polycrystalline silicon film 105 having a thickness of about 200 [nm] and an impurity concentration of about $4\times10^{20}$ [atoms/cm$^3$] is formed by a chemical vapor deposition method all over the p-type semiconductor substrate 91 including the gate insulating film 103 and the gate insulating film 104. After this, a silicon oxide film 106 having a thickness of about 50 [nm] is formed by a chemical vapor deposition method all over the polycrystalline silicon film. The manufacturing steps up to this point are shown in FIG. 36.

Figure 37:
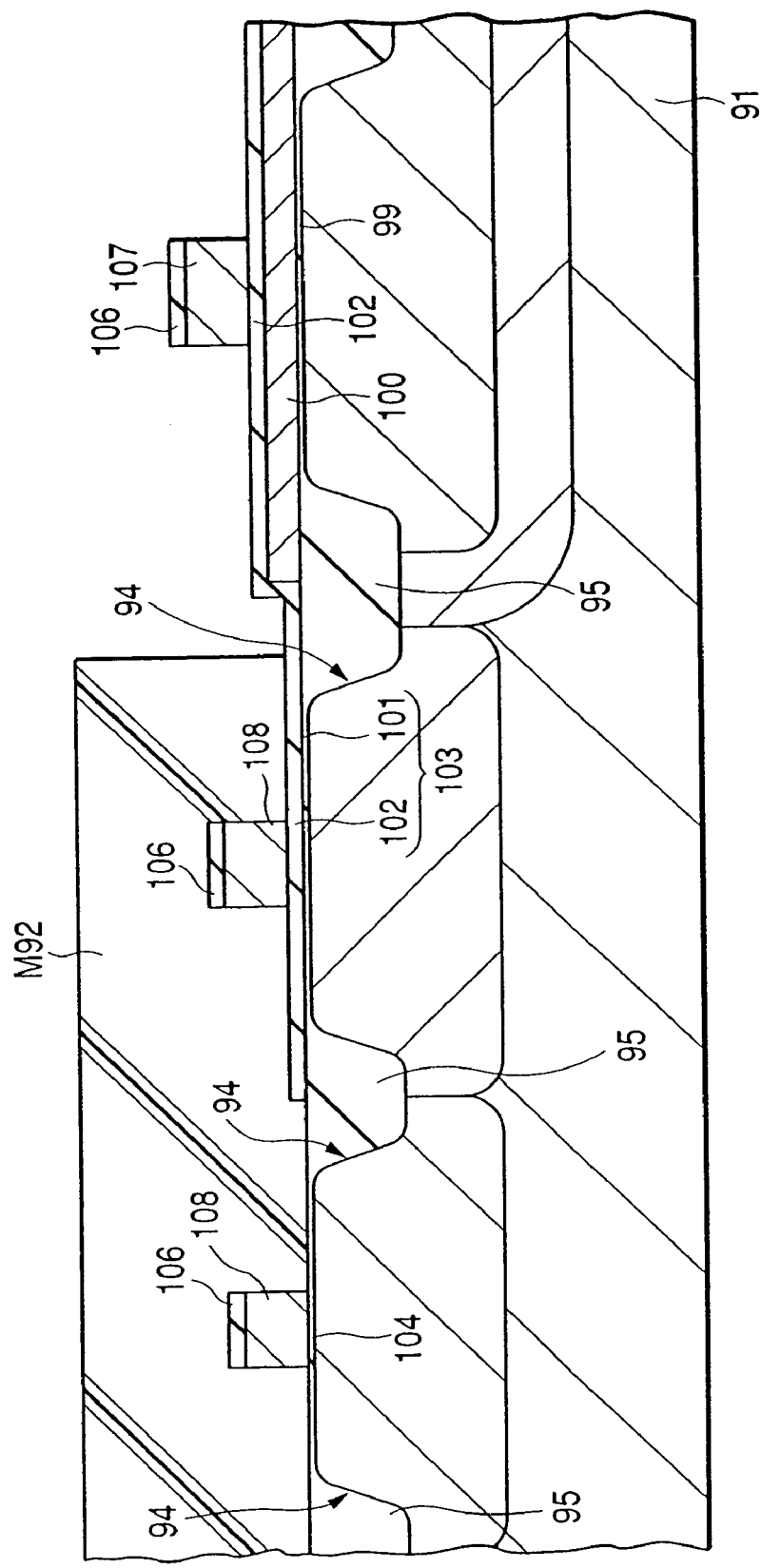
FIG. 37 is a section for illustrating the method for manufacturing the semiconductor integrated circuit device.

Next, the silicon oxide film 106 and the polycrystalline silicon film 105 are individually patterned to form control gate electrodes 107 over the interlayer insulating film (the deposited film 102) and gate electrodes 108 over the gate insulating film 103 and the gate insulating film 104. After this, there is formed a mask M92 of a photoresist film covering the second and third element forming regions while leaving the first element forming region open. The manufacturing steps up to this point are shown in FIG. 37.

Next, the mask M92 is used as the etching mask to pattern the deposited film 102 and the floating gate member 100 individually and sequentially to form floating gate electrodes 109.

Next, the first element forming region is selectively doped with an impurity by an ion implantation method to form a pair of n-type semiconductor regions 110 which are the source region and the drain region. At this step, there is formed a nonvolatile memory element QF2. After this, side wall spacers 111 of a nitride film having a thickness of 80 [nm] are individually formed on the side faces of the gate electrodes 108 and on the side faces of the electrodes of the nonvolatile memory element QF2.

Next, the second element forming region is selectively doped with an impurity by an ion implantation method to form a pair of p-type semiconductor regions 112, thus forming a field effect transistor Q8.

Figure 38:
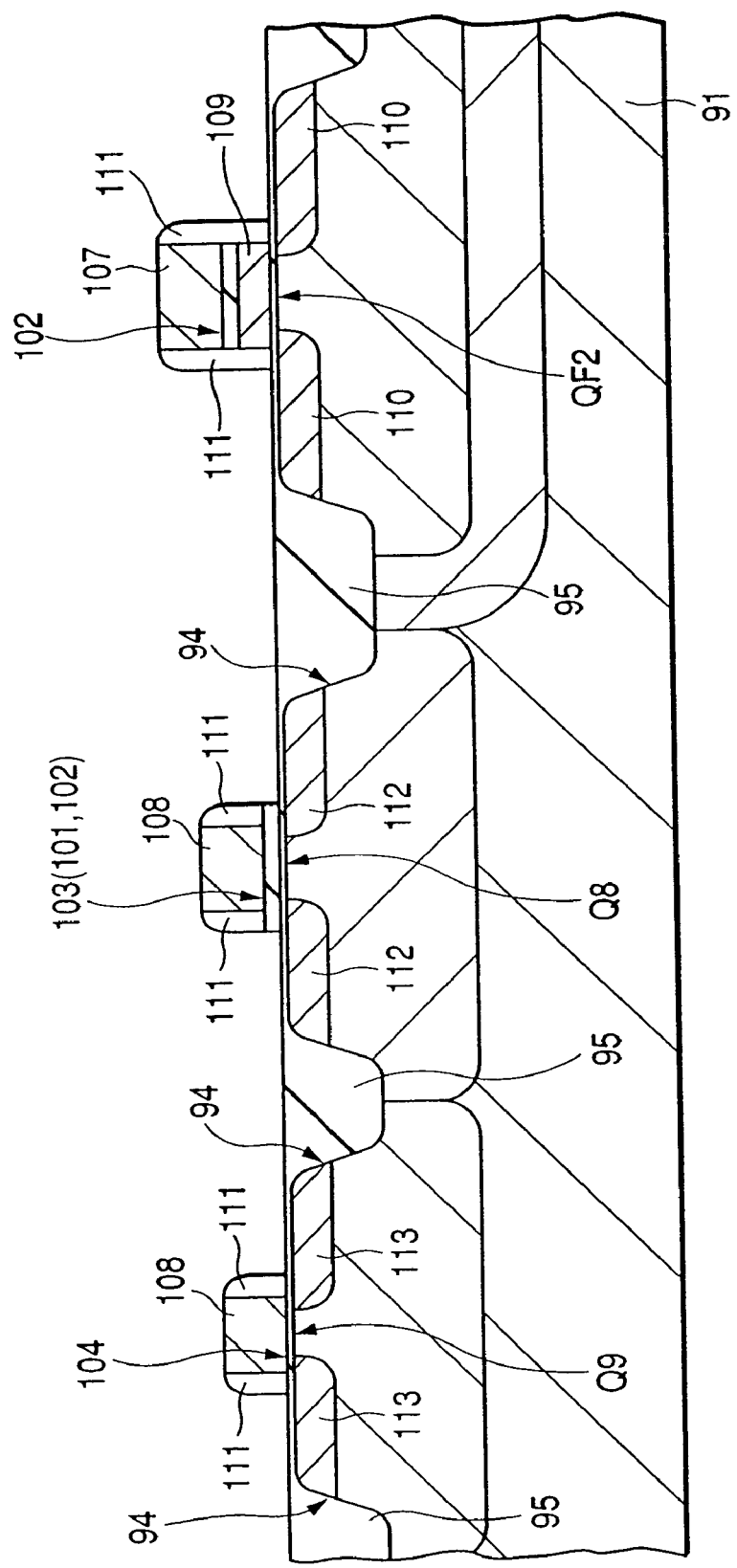
FIG. 38 is a section for illustrating the method for manufacturing the semiconductor integrated circuit device.

Next, the third element forming region is selectively doped with an impurity by an ion implantation method to form a pair of n-type semiconductor regions 113, thus forming a field effect transistor Q9, as shown in FIG. 38. As a result, there is completed a major portion of the semiconductor integrated circuit device of this embodiment. After this, the manufacturing method of this embodiment is completed by forming the interlayer insulating film, the connection holes and the metal wiring.

In this embodiment, the height of the step at the element isolating regions between the third element forming region and the buried insulating film 95 is reduced to 10 [nm], i.e., about one third of the prior art. Even if the gate insulating film 103 and the field effect transistor Q8 and the interlayer insulating film of the nonvolatile memory element QF2 are made of the same deposited film, moreover, it is possible to realize the normal operation of the transistors and memory cells without any deterioration in the reliability.

In this embodiment, moreover, the deposited film 102 or the gate insulating film 103 of the field effect transistor Q8 and the interlayer insulating film (the deposited film 102) of the nonvolatile memory element QF2 are formed at the same manufacturing step, so that the number of steps of manufacturing the semiconductor integrated circuit device can be reduced.

[Embodiment 5]

This embodiment will be described taking the case in which the invention is applied to a DRAM (a semiconductor integrated circuit device) employing the 0.25 micron manufacturing technique.

Figure 39:
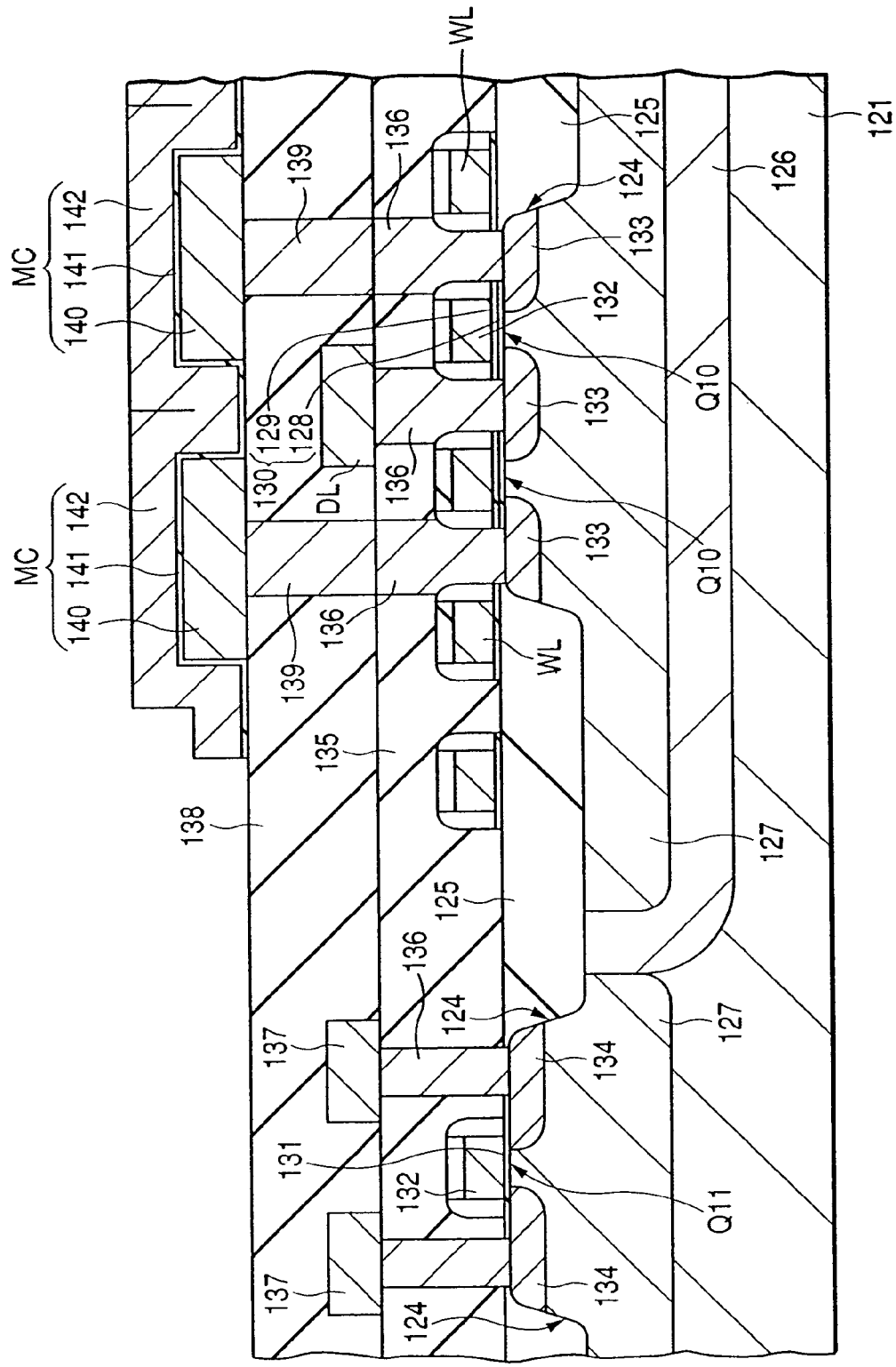
FIG. 39 is a section showing a schematic construction of a DRAM (a semiconductor integrated circuit device representing an Embodiment 5 according to the invention.
Figure 42:
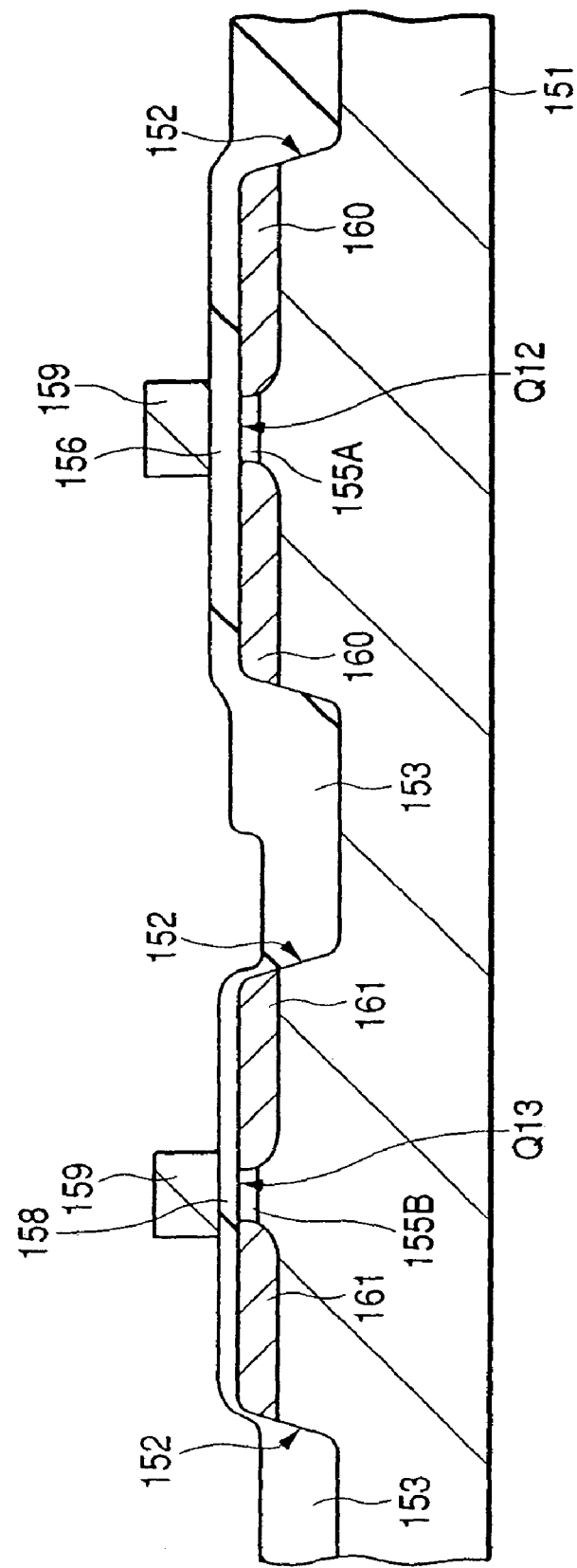
FIG. 42 is a section for illustrating the problem.
Figure 43:
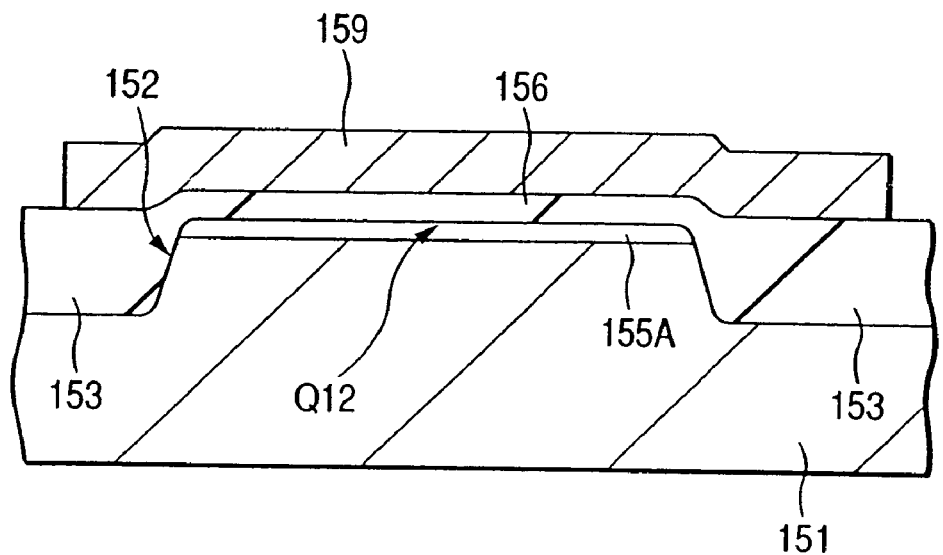
FIG. 43 is a section for illustrating the problem.
Figure 44:
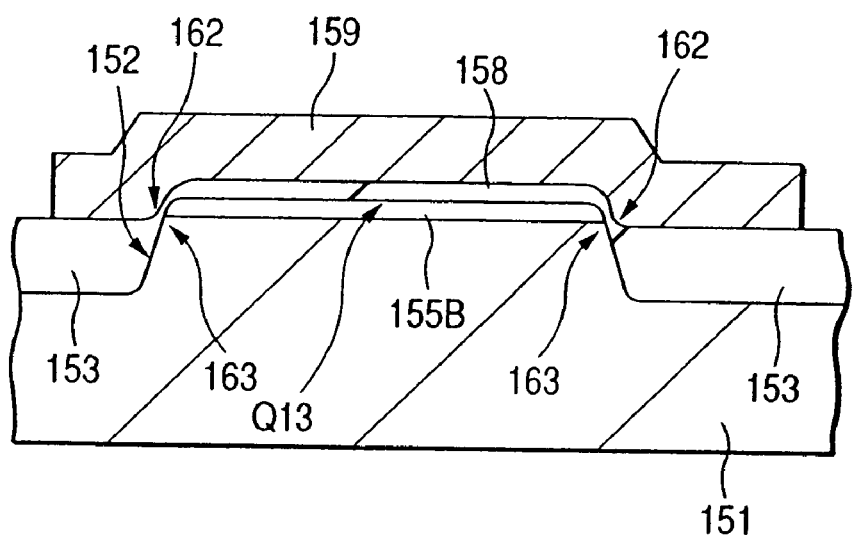
FIG. 44 is a section for illustrating the problem.
Figure 45:
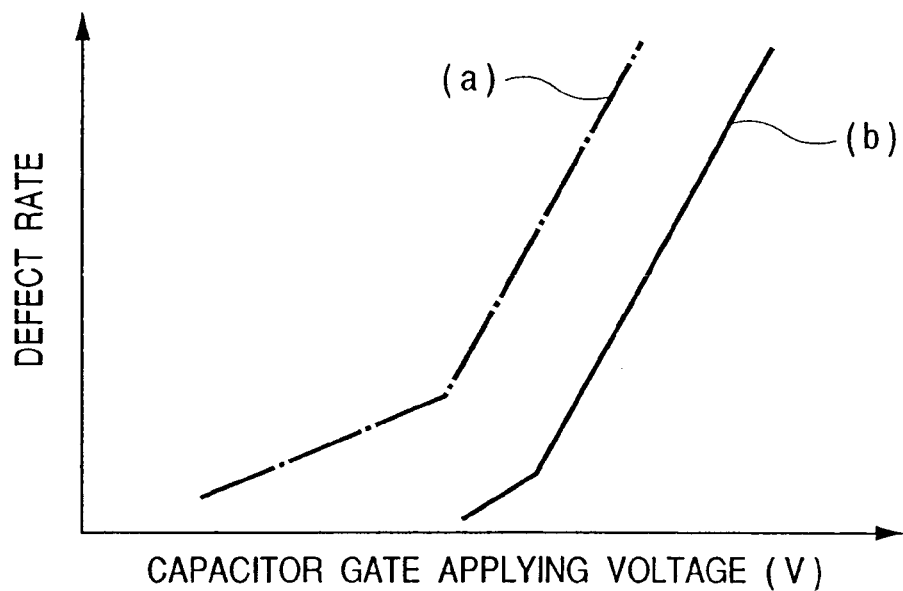
FIG. 45 is a diagram for comparing the breakdown voltage distribution of a capacitor with the groove type element isolation and the breakdown voltage of a capacitor with the LOCOS element isolation.
Figure 46:
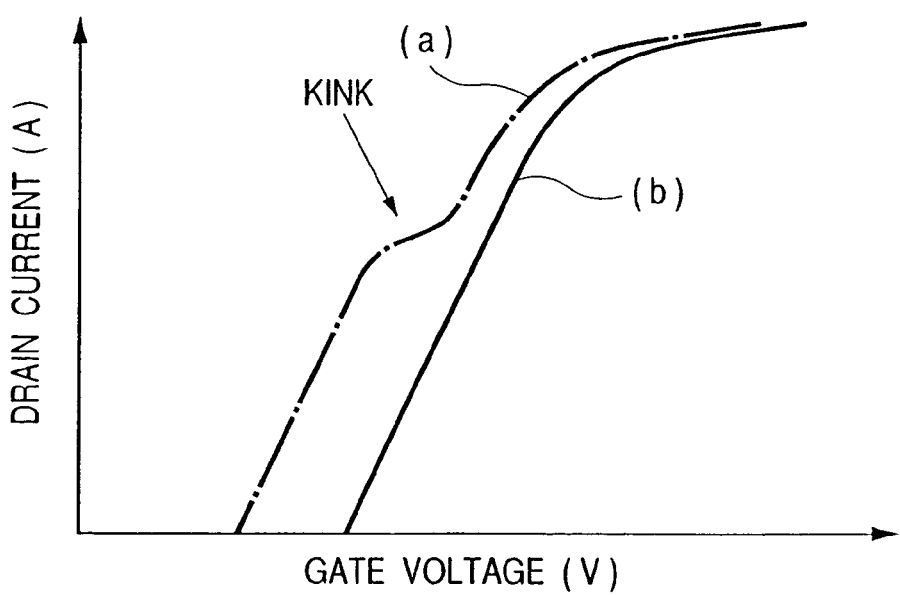
FIG. 46 is a diagram for comparing the sub-thresh characteristics of a field effect transistor with the groove type element isolation and the sub-thresh characteristics of a field effect transistor with the LOCOS element isolation.

FIG. 39 is a section showing a schematic construction of a DRAM of Embodiment 5 according to the invention and shows field effect transistors constituting a memory cell for storing information of 1 bit and a peripheral circuit.

As shown in FIG. 39, the DRAM of this embodiment is constructed mainly of the p-type semiconductor substrate 121 made of single crystalline silicon.

Over the p-type semiconductor substrate 121, there are formed a plurality of element forming regions. These element forming regions are individually defined by grooves 124 which are formed in the element isolating regions of the main surface of the p-type semiconductor substrate 121, and a buried insulating film 125 buried in the grooves 124, thereby being insulated and isolated (electrically isolated) from one another. A deep n-type well region 126 and a p-type well region 127 are formed in the memory cell portion of the p-type semiconductor substrate 121, and a p-type well region 127 are formed in the peripheral circuit portion of the p-type semiconductor substrate 121.

The memory cell where information of 1 bit stored is constructed to include a series circuit of a memory cell selecting field effect transistor Q10 and an information storing capacitive element MC and is arranged in the region where word lines WL and data lines DL intersect.

The field effect transistor Q10 is formed in the first element forming region of the main surface of the p-type semiconductor substrate 121. This field effect transistor Q10 is made of an n-channel type MISFET and is so constructed as to include a p-type well region 127 to serve as the channel forming region a gate insulating film 130, gate electrodes 132, and a pair of n-type semiconductor regions 133 which are the source region and the drain region.

The capacitive element MC has a stack structure, in which a dielectric film and an electrode 142 are sequentially stacked on electrodes 140. These electrodes 140 are electrically connected to one of the n-type semiconductor region 133 of the field effect transistor Q10 through conductive plugs 139 buried in an interlayer insulating film 138, and conductive plugs 136 buried in an interlayer insulting film 135. The other n-type semiconductor region 133 of the field effect transistor Q10 is electrically connected to the data lines DL through the conductive plugs 136.

A field effect transistor Q11 constituting the peripheral circuit is constructed in the second element forming region of the p-type semiconductor substrate 121. This field effect transistor Q11 is an n-channel type MISFET and includes a p-type well region 127 to serve as the channel forming region, a gate insulating film 131, gate electrodes 132, and a pair of n-type semiconductor regions 134 which are the source region and the drain region. To the paired n-type semiconductor regions 134, individually, there are electrically connected lines 137 through the conductive plugs 136 which are buried in the interlayer insulating film 135.

The gate insulating film 130 of the field effect transistor Q10 of the memory cell is formed of a thermally oxidized film 128 and a deposited film 129. The thermally oxidized film 128 has a thickness of about 2 [nm], and the deposited film 129 has a thickness of about 6 [nm]. The gate insulating film 131 of the field effect transistor Q11 constituting the periphery 1 circuit is a thermally oxidized film having a thickness of about 4.5 [nm]. The gate insulating film 130 and the gate insulating film 131 are individually formed by the methods used in the foregoing embodiments.

In this embodiment, the height of the step at the element isolating regions between the second element forming region and the buried insulating film 125 is 4 [nm]. When the gate insulating film of the field effect transistor of the memory cell is an ordinary thermally oxidized film, the height of the step at the end portions of the element isolating regions between the second element forming region and the buried insulating film 125 is 10 [nm]. Therefore, the step is reduced to one half by the invention. As a result, the gate defect density of the field effect transistor Q11 for the lower voltage can be drastically reduced from 0.8 defects/cm$^2$ of the prior art to 0.3 defects/cm$^2$, so that the production yield of the memory can be improved by 20%. Moreover, the gate breakdown voltage of the field effect transistor Q11 for low voltage can be improved by 15%. In this embodiment, the effectiveness of the DRAM of the invention can be confirmed, and it is found that the industrial influence is great.

Although our invention has been specifically described taking the case of its embodiments, it should not be limited thereto but could naturally be modified in various manners without departing from the gist thereof.

For examples the invention could be applied to a semiconductor integrated circuit device including four or more kinds of field effect transistors having gate insulating films of different thicknesses. The effects produced from a representative aspect of the invention disclosed herein will be briefly described in the following.

It is possible to enhance the reliability of the semiconductor integrated circuit device which includes a plurality of kinds of field effect transistors having gate insulating films of different thicknesses.

What is claimed is:

1. A semiconductor integrated circuit device, comprising:
    a first MISFET having a first gate insulating film formed over a first element forming region of a main surface of a semiconductor substrate and a first gate electrode formed over said first gate insulating film; and
    a second MISFET having a second gate insulating film formed over a second element forming region of said main surface of said semiconductor substrate and a second gate electrode formed over said second gate insulating film,
    said second gate insulating film being thinner than said first gate insulating film, wherein said first gate insulating film includes a thermally oxidized film and a deposited film formed over said thermally oxidized film and having a thickness greater than that of said thermally oxidized film, wherein said second gate insulating film includes a thermally oxidized film, wherein a thickness of said thermally oxidized film of said first gate insulating film is thinner than that of said thermally oxidized film of said second gate insulating film, wherein said first element forming region and said second element forming region are individually isolated by an element isolation region, wherein said element isolation region is formed by forming grooves in said substrate, depositing an insulating film over said grooves by a vapor deposition method, and polishing said insulating film so as to fill said insulating film in said grooves, and wherein said deposited film extends over said element isolation region such that an edge portion of said first gate electrode is formed over said deposited film at a portion of said deposited film positioned over said element isolation region.

2. A semiconductor integrated circuit device according to claim 1, wherein an etching rate of said insulating film filled in said groove is lower than that of said thermally oxidized film.

3. A semiconductor integrated circuit device according to claim 1, wherein said deposited film is formed by a vapor deposition method.

4. A semiconductor integrated circuit device according to claim 3, wherein said vapor deposition method is a chemical vapor deposition method.

5. A semiconductor integrated circuit device according to claim 1, wherein said element isolation region is an insulating region having a thickness greater than that of said first gate insulating film.

6. A semiconductor integrated circuit device according to claim 5, wherein said insulating film is integrally formed with an element isolation film defining a first MISFET forming region, and wherein an etching rate of said insulating film filled in said groove is lower than that of a thermally oxidized film.

* * * * *